United States Patent
Wi

(10) Patent No.: US 9,054,146 B2
(45) Date of Patent: Jun. 9, 2015

(54) SUBSTRATE TRANSFER EQUIPMENT AND HIGH SPEED SUBSTRATE PROCESSING SYSTEM USING THE SAME

(75) Inventor: Soon-Im Wi, Suwon-si (KR)

(73) Assignee: NEW POWER PLASMA CO., LTD., Gyeonggi-do (KR)

( * ) Notice: Subject to any disclaimer, the term of this patent is extended or adjusted under 35 U.S.C. 154(b) by 1052 days.

(21) Appl. No.: 12/298,972

(22) PCT Filed: May 1, 2007

(86) PCT No.: PCT/KR2007/002133
§ 371 (c)(1),
(2), (4) Date: Mar. 18, 2009

(87) PCT Pub. No.: WO2007/126289
PCT Pub. Date: Nov. 8, 2007

(65) Prior Publication Data
US 2011/0318141 A1    Dec. 29, 2011

(30) Foreign Application Priority Data

May 3, 2006   (KR) .......... 10-2006-0039744
Sep. 18, 2006 (KR) .......... 10-2006-0090225
Dec. 18, 2006 (KR) .......... 10-2006-0129476
Jan. 23, 2007 (KR) .......... 10-2007-0007160

(51) Int. Cl.
H01L 21/677   (2006.01)
H01L 21/687   (2006.01)
H01L 21/67    (2006.01)

(52) U.S. Cl.
CPC .... *H01L 21/67742* (2013.01); *H01L 21/68707* (2013.01); *Y10S 414/139* (2013.01); *Y10S414/141* (2013.01); *Y10S 901/30* (2013.01); *H01L 21/67196* (2013.01); *H01L 21/67745* (2013.01)

(58) Field of Classification Search
CPC ............... H01L 21/67196; H01L 21/67742; H01L 21/67745; H01L 21/68707
USPC .......................... 414/217; 294/213
See application file for complete search history.

(56) References Cited

U.S. PATENT DOCUMENTS 4,585,260 A * 4/1986 Skovajsa ............. 294/213
6,062,798 A * 5/2000 Muka ............. 414/416.03

(Continued)

FOREIGN PATENT DOCUMENTS

KR   10-2005-0045339 A   5/2005
KR   10-2005-0092278 A   9/2005

*Primary Examiner* — Scott Lowe
(74) *Attorney, Agent, or Firm* — IP & T Group LLP

(57) ABSTRACT

There are provided a substrate transferring apparatus for continuously loading/unloading a plurality of substrates in and from a process chamber to reduce time spent on transferring the substrates and to improve productivity and a substrate processing system using the same. The substrate transfer apparatus is installed in the transfer chamber and transfers substrates between first and second process chambers which is positioned lateral sides of the transfer chamber and a load rock chamber. The substrate transfer apparatus includes a driving unit to supply a rotational force, a spindle connected to the driving unit, first swivel plate arms to load/unload substrate to/from first process chamber, and second swivel plate arms to load/unload substrate to/from second process chamber. Since substrates before and after being processed are rapidly exchanged during the simultaneous or continuous process of plural substrates, processing rate increases and overall productivity can be increased.

31 Claims, 22 Drawing Sheets

(56) References Cited

U.S. PATENT DOCUMENTS

| | | | |
|---|---|---|---|
| 6,318,957 B1 * | 11/2001 | Carr et al. | 414/810 |
| 6,857,838 B2 * | 2/2005 | Kuroda | 414/331.01 |
| 7,048,316 B1 * | 5/2006 | Blank et al. | 294/213 |
| 2002/0048506 A1 * | 4/2002 | Babbs et al. | 414/783 |
| 2004/0105737 A1 * | 6/2004 | Ozawa et al. | 414/217 |
| 2005/0211169 A1 | 9/2005 | Choi et al. | |

* cited by examiner

SUBSTRATE TRANSFER EQUIPMENT AND HIGH SPEED SUBSTRATE PROCESSING SYSTEM USING THE SAME

TECHNICAL FIELD

The present invention relates to a substrate transferring apparatus and a substrate processing system, and more particularly, to a substrate transferring apparatus for continuously loading/unloading a plurality of substrates in and from a process chamber to reduce time spent on transferring the substrates and to improve productivity and a substrate processing system using the same.

BACKGROUND ART

Recently, a cluster system capable of simultaneously process a plurality of substrates is commonly employed in substrate processing systems for manufacturing liquid crystal displays, plasma panel displays, and semiconductor devices.

In general, the cluster system refers to a multi-chamber type substrate processing system including a transfer robot (or a handler) and a plurality of substrate processing modules provided around the transfer robot.

The cluster system includes a transfer chamber and the transfer robot provided in the transfer chamber to be freely rotatable. Process chambers for performing processes of processing substrates are mounted to the sides of the transfer chamber. Such a cluster system simultaneously processes a plurality of substrates or continuously performs various processes to increase an amount of processing substrates. In order to increase the amount of processing substrates, a plurality of substrates is simultaneously processed in a single process chamber to increase the amount of processing substrates per unit time.

However, although the plurality of substrates is simultaneously (or continuously) processed in the process chamber, when substrates before and after being processed are not effectively exchanged in the process chamber, loss of time is generated.

Moreover, when a conventional cluster system includes a hexagonal transfer chamber (basically, including four process chambers and two load lock chambers), due to the area occupied by the transfer chamber, the area of the cluster system and the width of the entire cluster system that is important to the arrangement of the cluster system in a manufacturing line increases more than a desired width and the scale of a vacuum system required for maintaining the transfer chamber in a vacuum state increases, so that apparatus cost and installation cost increase. In addition, the area of the transfer chamber more increases as the number of provided process chambers increases.

Thus, a substrate processing system capable of simultaneously (or continuously) processing the plurality of substrates and of effectively exchanging the substrates before and after being processed in the process chamber to process the plurality of substrates is required.

DISCLOSURE OF INVENTION

Technical Problem

Therefore, the present invention is directed to provide a substrate transfer apparatus having a structure in which substrates are effectively processed and a substrate processing system using the same.

The present invention also provides a substrate transfer apparatus in which time spent on transferring substrates is reduced to improve productivity and a substrate processing system using the same.

The present invention also provides a substrate transfer apparatus having a small system area and a substrate processing system using the same.

The present invention also provides a substrate transfer apparatus having a structure in which time spent on processes is reduced and a substrate processing system using the same.

The present invention also provides a substrate transfer apparatus having a structure in which the availability of a process chamber is improved and a substrate processing system using the same.

The present invention also provides a substrate transfer apparatus having a remarkably reduced the system area and the system width and a substrate processing system using the same.

The present invention also provides a substrate transfer apparatus in which an unnecessary vacuum area is reduced to minimize apparatus cost and installation cost and a substrate processing system using the same.

The present invention also provides a substrate processing system capable of effectively using the layout of a space in a semiconductor manufacturing factory.

The present invention also provides a substrate processing system in which the number of processing modules corresponding to one transfer robot is reduced to improve throughput.

The present invention also provides a substrate processing system including a substrate transfer apparatus having a small driving area.

Technical Solution

In accordance with an exemplary embodiment, the present invention provides an apparatus for transferring substrates. The apparatus for transferring substrates between a load lock chamber and first and second process chambers to process a plurality of substrates, which comprises a driving unit to supply a rotational force; at least one spindle connected to the driving unit; a plurality of first swivel plate arms to load/unload the substrates to the first process chamber; and a plurality of second swivel plate arms to load/unload the substrates to the second process chamber.

Preferably, each of the first and second swivel plate arms comprises at least one swivel plate arm to load substrates before being processed; and at least one swivel plate arm to unload processed substrates.

Preferably, the first swivel plate arms and the second swivel plate arms are separately mounded, and the spindle includes at least two different spindles which rotate independently.

Preferably, the driving unit includes at least one driving unit to supply a rotational force through the at least two different spindles.

Preferably, each of the first swivel plate arms and the second swivel plate arms includes a horseshoe-shaped end effector having an opening with an opened side and a support having an upper side to which rims of the substrate are positioned.

Preferably, the end effector includes an entrance path through which the end effector of an atmospheric pressure transfer robot installed in the load lock chamber enters and exits to transfer and receive the substrates.

In accordance with another exemplary embodiment, the present invention provides a substrate processing system using the apparatus for transferring substrates, the system comprises a first process chamber including at least two substrate supporting tables; a second process chamber including at least two substrate supporting tables; a transfer chamber in which the substrate transfer apparatus is installed; a first substrate entrance formed between the first process chamber and the transfer chamber; a second substrate entrance formed between the second process chamber and the transfer chamber; and a third substrate entrance formed between the transfer chamber and the exterior; wherein the substrate transfer apparatus receives and transfers the substrates before and after being processed from and to the exterior through the third substrate entrance, such that the substrates before being processed are transferred to the first or second process chamber and the processed substrates processed in the first or second process chamber are transferred to the exterior through the third substrate entrance.

Preferably, the substrate processing system further comprises a load lock chamber connected to the third substrate entrance, and the load lock chamber comprises an atmospheric pressure transfer robot to transfer the substrates under atmospheric pressure.

Preferably, the substrate processing system further comprises a cooling chamber to cool the processed substrates discharged through the third substrate entrance.

Preferably, the first and second process chambers comprise plasma chambers in which plasma processes are carried out.

Preferably, the first process chamber comprises a plasma chamber in which a plasma process is carried out and the second process chamber comprises a cooling chamber to cool heated substrates after being processed.

Preferably, the substrate processing system further comprises a fourth substrate entrance formed between the transfer chamber and another exterior, and the substrate transfer apparatus receives the substrates before being processed from the exterior through the third substrate entrance and transfers the processed substrates to the exterior through the fourth substrate entrance.

Preferably, the substrate processing system further comprises a load lock chamber connected to the fourth substrate entrance, and the load lock chamber includes an atmospheric pressure transfer robot to transfer the substrates under the atmospheric.

Preferably, the substrate processing system further comprises a cooling chamber to cool the processed substrates discharged through the fourth substrate entrance.

In accordance with another exemplary embodiment, the present invention provides an apparatus for transferring substrates. An apparatus for transferring substrates in a transfer chamber between a load lock chamber and process chambers to process a plurality of substrates, which comprises transfer members scattered and disposed on the verge of the transfer chamber; and the plurality of transfer members to simultaneously receive a plurality of substrates provided to a standby position of the transfer chamber through the load lock chamber to transfer the plurality of substrates to the upper sides of substrate supporting tables respectively installed in the process chambers, and to receive respective substrates from the upper sides of the substrate supporting tables to concentrately transfer the same to the standby position of the transfer chamber.

Preferably, each of the transfer members comprises a driving unit to supply a rotational force; two spindles connected to the driving unit; and a plurality of swivel plate arms to load/unload the substrates to/from the corresponding substrate supporting tables.

Preferably, each of the swivel plate arms comprises: a swivel plate arm to load substrates before being processed; and a swivel plate arm to unload processed substrates.

Preferably, each of the swivel plate arms comprises a horseshoe-shaped end effector having an opening with an opened side and a support having an upper side to which rims of the substrate are positioned.

Preferably, the transfer members are unfolded such that the end effectors of the swivel plate arms are positioned in the upper sides of the corresponding substrate supporting tables, and are folded such that the end effectors of the swivel plate arms are vertically aligned with a single aligning line at the standby position of the transfer chamber.

In accordance with another exemplary embodiment, the present invention provides a substrate transfer apparatus installed in a transfer chamber to transfer substrates between a load lock chamber and process chambers to process a plurality of substrates. The substrate transfer apparatus comprises a plurality of spindles disposed on the verge of the transfer chamber to be spaced apart from each other; a driving unit to supply a driving force to the plurality of spindles; and a plurality of swivel plate arms respectively installed to the plurality of spindles to swivel for the loading/unloading the substrates to/from the corresponding process chambers.

Preferably, each of the swivel plate arms comprises a horseshoe-shaped end effector having an opening with an opened side and a support having an upper side to which rims of the substrate are positioned, and end effectors of the swivel plate arms swivel to be positioned in the upper sides of corresponding substrate supporting tables and to be vertically aligned with a single aligning line at a standby position of the transfer chamber.

Preferably, each of the swivel plate arms comprises at least two rod-antenna type extensible plate arms.

Preferably, each of the swivel plate arms swivel toward the substrate supporting tables at the standby position of the transfer chamber and the extensible swivel plate arms are withdrawn step by step such that the end effectors are positioned in the upper sides of the substrate supporting tables.

In accordance with another exemplary embodiment, the present invention provides a substrate processing system. A substrate processing system comprises a transfer chamber in which a substrate transfer apparatus is installed; and first and second process chambers connected to the lateral sides of the transfer chamber through first and second entrances and including two substrate supporting tables; the substrate transfer apparatus including four transfer members disposed on the verge of the transfer chamber to be spaced apart from each other, wherein the transfer members are unfolded to simultaneously receive four substrates provided from the exterior to a standby position of the transfer chamber and to transfer the four substrates on the upper sides of four substrate supporting tables installed in the first and second process chambers, and are folded to receive the respective substrates from the upper sides of the four substrate supporting tables and to transfer the respective substrates to the standby position of the transfer chamber.

Preferably, each of the transfer members comprises a driving unit to supply a rotational force; two spindles connected to the driving unit; and a plurality of swivel plate arms to load/unload the substrates to/from the substrate supporting tables.

Preferably, each of the swivel plate arms comprises a horseshoe-shaped end effector having an opening with an opened side and a support having an upper side to which rims of the substrate are positioned, and the transfer members swivel such that end effectors of the swivel plate arms swivel are positioned in the upper sides of corresponding substrate supporting tables and are vertically aligned with a single aligning line at the standby position of the transfer chamber.

Preferably, each of the swivel plate arms comprises at least two rod-antenna type extensible plate arms.

Preferably, the substrate processing system, further comprises a load lock chamber connected to in front side of the transfer chamber through a third substrate entrance, wherein the load lock chamber comprises an atmospheric pressure transfer robot to transfer the substrates under atmospheric pressure.

Preferably, the front side of the transfer chamber has a shape in which the third entrance is depressed inwardly.

Preferably, the substrate processing system further comprises a cooling chamber positioned in the load lock chamber to cool processed substrates discharged to the load lock chamber through the third substrate entrance.

Preferably, the first and second process chambers comprise plasma chambers in which plasma processes are carried out.

In accordance with another exemplary embodiment, the present invention provides a substrate processing system. A substrate processing system comprises a first process chamber including one substrate supporting table; a second process chamber including one substrate supporting table; a transfer chamber in which a substrate transfer apparatus is installed; a first substrate entrance formed between the transfer chamber and the exterior; a second substrate entrance formed between the first process chamber and the transfer chamber; and a third substrate entrance formed between the second process chamber and the transfer chamber; and the substrate transfer apparatus receives and transfers the substrates before and after being processed from and to the exterior through the first substrate entrance, such that the substrate transfer apparatus transfers the received substrates before being processed to the first or second process chamber through second or the third substrate entrance and receive the processed substrates processed in the first or second process chamber through the second or third substrate entrance and transfers to the exterior through the first substrate entrance.

Preferably, the substrate processing system further comprises a load lock chamber connected to the first substrate entrance, wherein the load lock chamber comprises an atmospheric pressure transfer robot to transfer the substrates under the atmospheric pressure.

Preferably, at least one of the first and second process chambers comprises a plasma chamber.

Preferably, at least one of the first and second process chambers comprises a cooling chamber.

Preferably, at least one of the first and second process chambers comprises an aligning chamber.

Preferably, the substrate transfer apparatus comprises a driving unit to supply a rotational force; at least one spindle connected to the driving unit; a plurality of first swivel plate arms to load/unload the substrates to/from the first process chamber; and a plurality of second swivel plate arms to load/unload the substrates to/from the second process chamber.

Preferably, the first swivel plate arms and the second swivel plate arms are separately mounded, and the spindle includes at least two different spindles which rotate independently.

Preferably, the driving unit includes at least one driving unit to supply a rotational force through the at least two different spindles.

Preferably, each of the first swivel plate arms and the second swivel plate arms includes a horseshoe-shaped end effector having an opening with an opened side and a support having an upper side to which rims of the substrate are positioned.

Preferably, wherein the end effector includes an entrance path through which the end effector of an atmospheric pressure transfer robot installed in the load lock chamber enters and exits to transfer and receive the substrates.

In accordance with another exemplary embodiment, the present invention provides a substrate processing system. A substrate processing system comprises a load lock chamber including an index in which a plurality of carriers are installed in front thereof; and a plurality of processing groups disposed in the rear side of the load lock chamber and stacked in multi-layers, and one of the plurality of process groups comprises a first transfer chamber to which a first substrate transfer apparatus is installed; and first and second process chambers connected to the lateral sides of the first transfer chamber through first and second entrances and including two substrate supporting tables, and another one of the plurality of processing groups comprises a second transfer chamber to which a second substrate transfer apparatus is installed; and first and second aligning chambers connected to the lateral sides of the second transfer chamber through first and second entrances and including two substrate aligners.

Preferably, the first transfer members are unfolded to simultaneously receive four substrates provided to a standby position of the first transfer chamber and to transfer the four substrates on the upper sides of four substrate supporting tables installed in the first and second process chambers, and are folded to receive the respective substrates from the upper sides of the four substrate supporting tables and to transfer the respective substrates to the standby position of the first transfer chamber.

Preferably, the second transfer members are unfolded to simultaneously receive four substrates provided to a standby position of the second transfer chamber and to transfer the four substrates to at least two substrate aligners installed in the first and second aligning chambers, and are folded to receive the respective aligned substrates from the at least two substrate aligners and to transfer the respective aligned substrates to the standby position of the second transfer chamber.

Preferably, another one of the plurality of processing groups comprises a third transfer chamber to which a third substrate transfer apparatus is installed; and a cooling chamber connected to the side of the third transfer chamber through first entrance to cool at least one substrate.

Preferably, each of the first, second, and third substrate transfer apparatuses comprises a driving unit to supply a rotational force; at least one spindle connected to the driving unit; and a plurality of swivel plate arms mounted to the spindle at different heights and to be positioned at corresponding positions in association with the spindle.

Preferably, each of the swivel plate arms comprises a horseshoe-shaped end effector having an opening with an opened side and a support having an upper side to which rims of the substrate are positioned, and the transfer apparatuses swivel such that end effectors of the swivel plate arms are positioned at corresponding positions and are vertically aligned with a single aligning line at the standby positions of the first, second, and third transfer chambers.

Preferably, the first substrate transfer apparatus comprises a plurality of swivel plate arms to simultaneously receive a plurality of substrates provided to a standby position of the first transfer chamber and to transfer the substrates to the substrate supporting tables on the upper sides of the first and second process chamber, to receive respective substrates from the upper sides of the substrate supporting tables, and to transfer the substrates to be concentrately transferred to the standby position of the first transfer chamber.

Preferably, each of the substrate aligners comprises a spin chuck to load the substrate; a sensor to detect the alignment of the substrate loaded on the spin chuck; and an elevator to adjust a height of the spin chuck according to heights of the swivel plate arms.

Preferably, the load lock chamber comprises an atmospheric pressure transfer robot to transfer the substrates under the atmospheric pressure.

Preferably, the first and second process chambers comprise plasma chambers to perform a plasma process.

Preferably, the load lock chamber comprises a double-armed atmospheric pressure transfer robot having four end effectors to take four substrates from the carriers at once and to transfer the four substrates to the first transfer chamber or the second transfer chamber, and each of the first and second transfer chambers comprises a third substrate entrance, through which the substrates from the load lock chamber enter and exit, and which are aligned with each other such that the transfer of the substrates is enabled when the atmospheric pressure transfer robot moved up and down.

Advantageous Effects

According to the present invention, substrates before and after being processed are rapidly exchanged in the substrate processing system in which a plurality of substrates is simultaneously or continuously processed, so that processing rate of the system can be increased and overall productivity of the substrates can be increased. Since a substrate transfer apparatus to simultaneously load and unload the substrate is provided, the process chamber is very easily implemented to process the plurality of substrates. Time for transferring substrates is reduced and as a result productivity increases. The area and width of the system are significantly reduced so that apparatus cost and installation cost can be minimized. Respective chambers for processing, aligning, and cooling the substrates are overlapped with each other so that a total bottom area of the substrate processing system can be reduced. Due to this, the clean room can be narrower than the conventional one and costs for the air-conditioning apparatus of the clean room can also be reduced. Moreover, since the traveling distance of the atmospheric pressure transfer robot for transferring the aligned substrates to a place for the process of the substrates or for transferring the processed substrates to the place for the cooling of the substrates is short and unnecessary operation such as a direction change does not need, time for the transfer of the substrates can be reduced and yield thereof can be increased.

BRIEF DESCRIPTION OF THE DRAWINGS

The above and other features and advantages of the present invention will become more apparent to those of ordinary skill in the art by describing in detail preferred embodiments thereof with reference to the attached drawings in which.

BEST MODE FOR CARRYING OUT THE INVENTION

Figure 1:
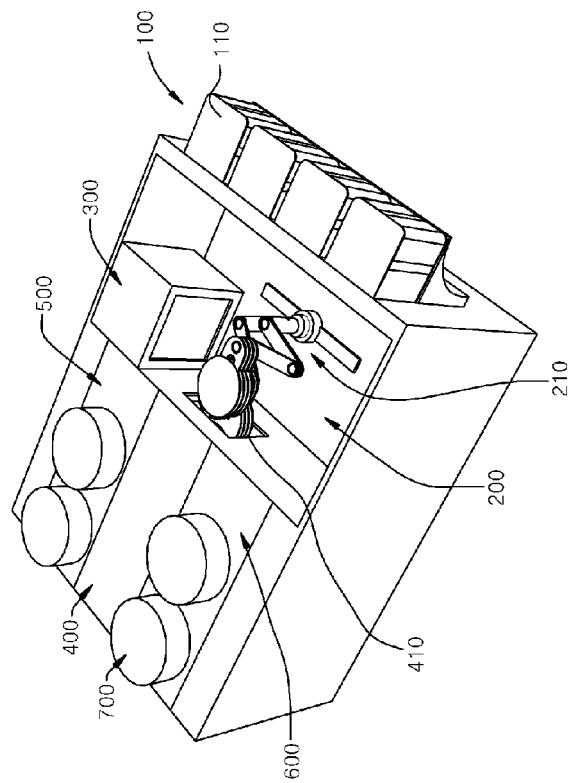
FIG. 1 is a view illustrating an overall structure of a substrate processing system according to a first embodiment of the present invention.

This invention may, however, be embodied in different forms and should not be construed as limited to the embodiments set forth herein. Rather, these embodiments are provided as teaching examples of the invention. In the drawings, the thickness of layers and regions are exaggerated for clarity. Like numbers refer to like elements. Detailed description of well-known functions and structures that can undesirably make the subject matter of the present invention confuse will be omitted. A substrate transferring apparatus according to the present invention and a substrate processing system using the same will now be described more fully hereinafter with reference to the accompanying drawings, in which preferred embodiments of the invention are shown.

Embodiment 1

Figure 2:
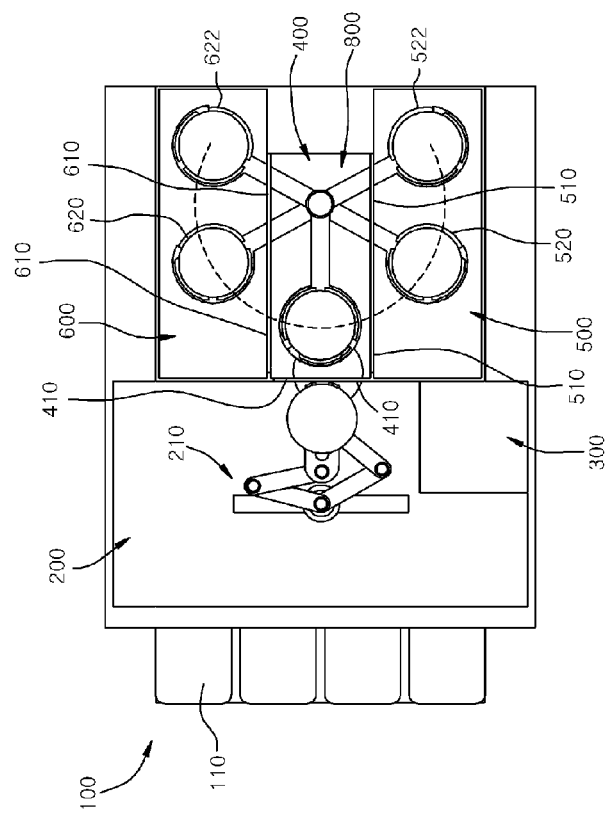
FIG. 2 is a plan view illustrating the substrate processing system of FIG. 1.

FIG. 1 is a view illustrating an overall structure of a substrate processing system according to a first embodiment of the present invention, and FIG. 2 is a plan view illustrating the substrate processing system of FIG. 1. Referring to FIG. 1, the substrate processing system according to the embodiment of the present invention includes first and second process chambers 500 and 600 and a transfer chamber 400 disposed between the first and second process chambers 500 and 600. An index 100 in which a plurality of carriers 110 are mounted is installed in front of a load lock chamber 200. The index 100 is referred to as an equipment front end module (hereinafter, referred to as 'EFEM') and is referred to as including the load lock chamber on occasion. If necessary, the load lock chamber 200 may include a cooling chamber 300 for cooling the processed substrates.

The load lock chamber 200 includes an atmospheric pressure transfer robot 210 operated under the atmospheric pressure. The atmospheric pressure transfer robot 210 transfers substrates between the transfer chamber 400 and the index 100. The atmospheric pressure transfer robot 210 operates to transfer substrates W between the carriers 110 and the transfer chamber 400. The atmospheric pressure transfer robot 210 is implemented by a robot including a double arm structure with four end effectors to take four substrates W out of the carrier 110 and to put the same into the transfer chamber 400. The atmospheric pressure transfer robot 210 can ascend and descend. Various robots used for common semiconductor manufacturing processes as well as the double arm type robot of this embodiment of the present invention may be used as the atmospheric pressure transfer robot 210. For example, robots having various structures such as a robot having a blade type arm to handle eight substrates W with one arm, a robot including four or more arms, and a combination of the above-mentioned robots may be used.

Respective two of substrate supporting tables 520, 522, 620, and 622 are provided in first and second process chambers 500 and 600 in the front end, in the rear end, and on respective paths where the swivel plate arms of a substrate transfer apparatus 800 swivel.

The first and second process chambers 500 and 600 include a plasma source 700 as vacuum chambers to perform a predetermined plasma processing process. The first and second process chambers 500 and 600 may be configured to perform various substrate processing operations. For example, the first and second process chambers 500 and 600 may be ashing chambers to remove photoresist using plasma, chemical vapor deposition (CVD) chambers to depose insulating layers, etch chambers to etch apertures or openings in the insulating layers in order to form interconnection structures, physical vapor deposition (PVD) chambers to depose barrier layers, or PVD chambers to depose metal layers.

The substrates W processed by the substrate processing system according to this embodiment of the present invention are typically wafer substrates for manufacturing a semiconductor circuit or glass substrates for manufacturing a liquid crystal display (LCD). A plurality of processing systems may be required in order to perform all of the processes required for completely manufacturing an integrated circuit or a chip other than the substrate processing system according to this embodiment of the present invention. However, in order to clarify the present invention, a common structure or structures that can be understood by those skilled in the art are omitted.

The substrate processing system according to this embodiment of the present invention includes the transfer chamber 400 located in the center and the first and second process chambers 500 and 600 respectively disposed at the lateral sides of the transfer chamber 400. At least two substrate supporting tables 520, 522, 620, and 622 are installed in the first and second process chambers 500 and 600. The transfer module 400 includes the substrate transfer apparatus 800.

A first substrate entrance 510 is formed between the transfer chamber 400 and the first process chamber 500, and a second substrate entrance 610 is formed between the transfer chamber 400 and the second process chamber 600. A third substrate entrance 410 is formed between the transfer chamber 400 and the load lock chamber 200. The first to third substrate entrances 510, 610, and 410 are opened and closed by slit valves (not shown).

The exchange of the substrates before and after being processed in the transfer chamber 400 performed by the atmospheric pressure transfer robot 210 is carried out under the atmospheric pressure where the first and second substrate entrances 510 and 610 are closed and the third substrate entrance 410 is opened. On the other hand, the exchange of the substrates before and after being processed performed, between the first and second process chambers 500 and 600 and the transfer chamber 400 by the substrate transfer apparatus 800, is carried out in a vacuum state where the third substrate entrance 410 is closed and the first and second substrate entrances 510 and 610 are opened.

Figure 3:
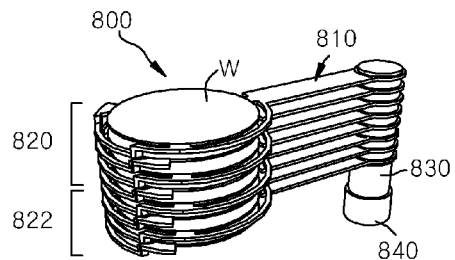
FIG. 3 is a perspective view illustrating a substrate transfer apparatus installed in a transfer chamber.

FIG. 3 is a perspective view illustrating a substrate transfer apparatus installed in a transfer chamber. Referring to FIG. 3, the substrate transfer apparatus 800 includes a driving unit 840 to provide a rotational force, a single spindle 830 connected to the driving unit 840, and a plurality of swivel plate arms 810 mounted in the spindle 830.

The plurality of swivel plate arms 810 include a plurality of first swivel plate arms to load/unload the substrates on/from the first process chamber 500 and a plurality of second swivel plate arms to load/unload the substrates on/from the second process chamber 600. The first and second swivel plate arms are alternately arranged. However, the first and second swivel plate arms may be sequentially arranged. The plurality of swivel plate arms 810 may be divided into loading arms 820 and unloading arms 822. In this case, the unloading arms 822 are preferably arranged to be lower than the loading arms 820. The loading arms 820 and the unloading arms 822 make pairs, and in an embodiment, as illustrated in the drawing, the eight swivel plate arms that make four pairs are provided. As illustrated in FIG. 2, the plurality of swivel plate arms 810 are unfolded in the sector form, can swivel, ascend, and descend. The loading arms 820 and the unloading arms 822 make pairs to operate.

Although not shown in the drawing, the driving unit 840 includes an electric motor to generate a rotational force and a gear assembly to transmit the generated rotational force to the spindle 830 such that the plurality of swivel plate arms 810 perform desired operations. Thus, the plurality of swivel plate arms 810 are mounted in the spindle 830 and, as illustrated in FIG. 2, are symmetrically unfolded in the sector form and folded at different radiuses of rotation about the transfer chamber 400.

Figure 4:
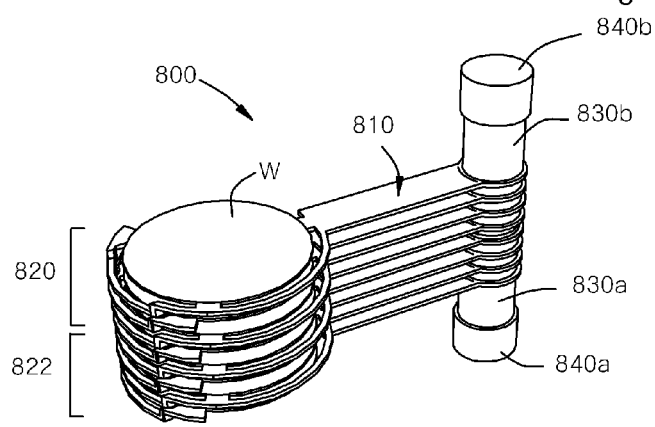
FIG. 4 illustrates an example in which the substrate transfer apparatus having an upper part and a lower part to be independently driven.

FIG. 4 illustrates an example in which the substrate transfer apparatus having an upper part and a lower part to be independently driven. Referring to FIG. 4, the substrate transfer apparatus 800 alternatively includes lower and upper spindles 830a and 830b to which the loading arms 820 and the unloading arms 822 are separately mounted and lower and upper driving units 840a and 840b to separately drive the lower and upper spindles 830a and 830b. Here, the two lower and upper spindles 830a and 830b are preferably aligned on the same shaft.

Figure 5:
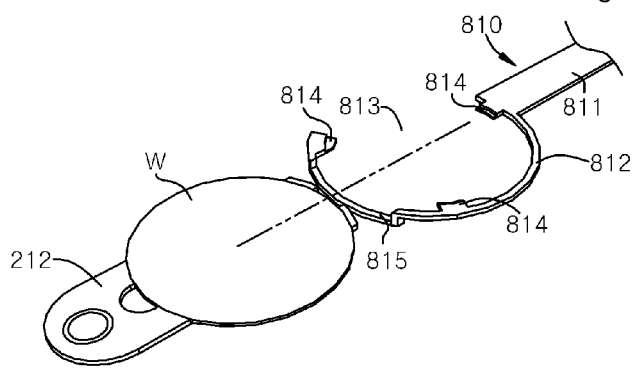
FIG. 5 is a perspective view illustrating the structure of a swivel plate arm.
Figure 6:
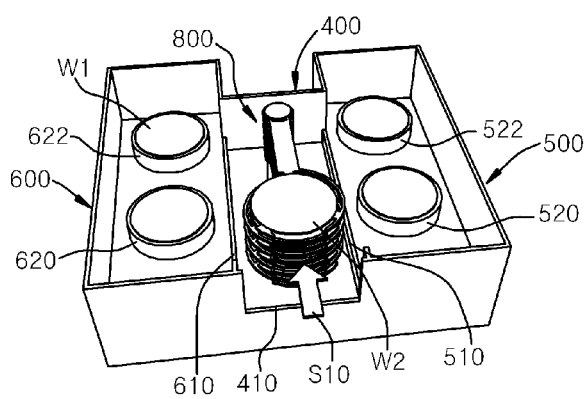
FIGS. 6 to 10 are views sequentially illustrating substrate exchanging operation performed by the substrate transfer apparatus.

FIG. 5 is a perspective view illustrating the structure of a swivel plate arm. Referring to FIG. 5, the plurality of swivel plate arms 810, installed in the substrate transfer apparatus 800, include horseshoe-shaped end effectors 812 having openings 813 with opened sides and a plurality of supports 814 whose upper sides to which rims of the substrates are positioned. The openings 813 are provided to allow lift pins installed in the substrate tables to enter and exit. The end effectors 812 have entrance paths 815 through which end effectors 212 of the atmospheric pressure transfer robot 210 enter and exit. The swivel plate arms 810 can be modified in other forms with the scope of the present invention.

FIGS. 6 to 10 are views sequentially illustrating substrate exchanging operation performed by the substrate transfer apparatus. Firstly, referring to FIG. 6, as indicated by an arrow S10, in a state where the first and second substrate entrances 510 and 610 are closed, substrates W1 before being processed are transferred to the substrate transfer apparatus 800 when the third substrate entrance 410 is opened. When the transfer of the substrates W1 is finished, the third substrate entrance 410 is closed and the transfer chamber 400 is switched to the same vacuum state as the interiors of the first and second process chambers 500 and 600. Absolutely, a pumping system for the vacuum state is provided in the system according to this embodiment of the present invention, but is omitted for convenience.

Figure 7:
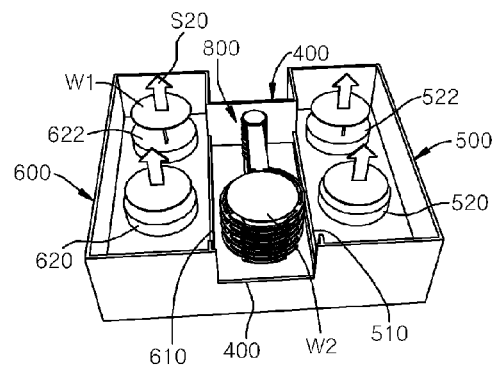

Next, as indicated by an arrow S20 in FIG. 7, when the lift pins of the plurality of supporting tables 520, 522, 620, and 622 ascend, processed substrates W2 are elevated to a predetermined height. In association with this operation, the first and second substrate entrances 510 and 610 are opened. At this time, the height of the elevated lift pins of the front substrate supporting table 520 and 620 is relatively lower than that of the lift pins of the rear substrate supporting tables 522 and 622. Thus, the rotation of the loading arms 820 for the loading/unloading does not interfere with the lift pins.

Figure 8:
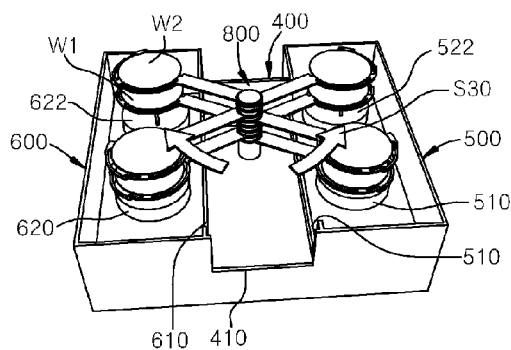
Figure 9:
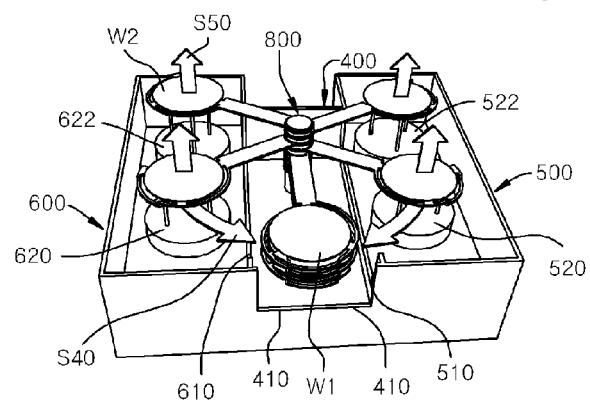

Continuously, as indicated by an arrow S30 in FIG. 8, the loading arms 820 and the unloading arms 822 of the substrate transfer apparatus 800 to make pairs symmetrically swivel and are unfolded in the sector form. At this time, the processed substrates W1 are transferred from the lift pins to the unloading arms 822. When the processed substrates W1 is transferred, continuously, as indicated by an arrow S40 in FIG. 9, the unloading arms 822 return to the initial position of the transfer chamber 400. As indicated by an arrow S50, the lift pins ascend again to receive the substrates W2 before being processed from the loading arms 820.

Figure 10:
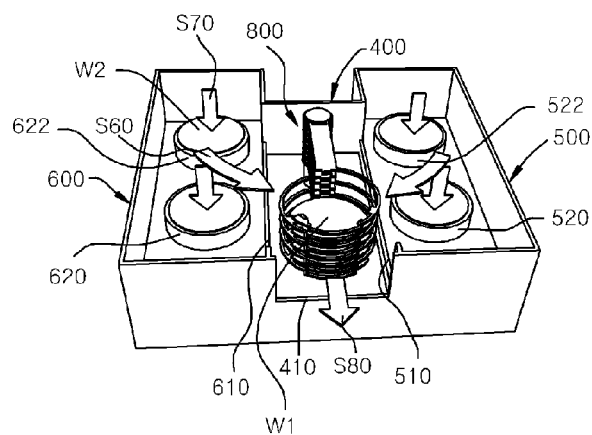

As indicated by an arrow S60 in FIG. 10, the loading arms 820 also return to the initial position of the transfer chamber 400. Simultaneously, the first and second substrate entrances 510 and 610 are closed again. As indicated by an arrow S70, the lift pins descend to place the substrates W2 before being processed on the substrate supporting tables 520, 522, 620, and 622.

The transfer chamber 400 is switched to the atmospheric pressure state and the third substrate entrance 410 is opened. The atmospheric pressure transfer robot 210 of the load lock chamber 200, as indicated by an arrow S80 in FIG. 10, receives the processed substrates W1 from the unloading arms 822 and exit from the transfer chamber 400.

Such the sequential operations of exchanging the substrates S10 to S80 are continuously and simultaneously performed within a range where the prior and post operations do not interfere with each other in order to minimize time required to exchange the substrates. It can be understood that the operations S10 and S80 are simultaneously performed during the repeated exchange of the substrates. In other words, the exchange of the substrates is performed between the transfer chamber 400 and the load lock chamber 200 by which the processed substrates unloaded in the prior operation are exchanged with the substrates before being processed to be loaded simultaneously.

The unloaded processed substrates W1 are transferred to the cooling chamber 300 by the atmospheric pressure transfer robot 210 and are cooled to be accumulated in the carriers 110. Although the cooling chamber 300 is separately provided in this embodiment of the present invention, if the transfer chamber 400 performs the cooling function, the separate cooling chamber 300 may be omitted. Alternatively, one of the first and second process chambers 500 and 600 may serve to as a cooling chamber. For example, it is possible to implement the first process chamber 500 as a plasma chamber and the second process chamber 600 as a cooling chamber. In this case, the first process chamber 500 performs the plasma process of the substrates, the substrate transfer apparatus 800 transfers the processed substrates from the first process chamber 500 to the second process chamber 600 to cool. The cooled substrates may be transferred from the second process chamber 600 to the load rock chamber 200.

As such, according to the substrate processing system in accordance with this embodiment of the present invention, in order to simultaneously process a plurality of substrates, the first and second process chambers 500 and 600 are arranged in parallel and the transfer chamber 400 is positioned between the first and second process chambers 500 and 600. The substrate transfer apparatus 800 is provided to enable the fast exchange of the substrates in this configuration, so that a great deal of substrates can be simultaneously processed and rapidly exchanged. In this embodiment, respective two substrates in the first and second process chambers 500 and 600, total four substrates can be simultaneously processed and exchanged in one process.**

The substrate processing system of the present invention can be modified by the following alternate embodiments.

Figure 11:
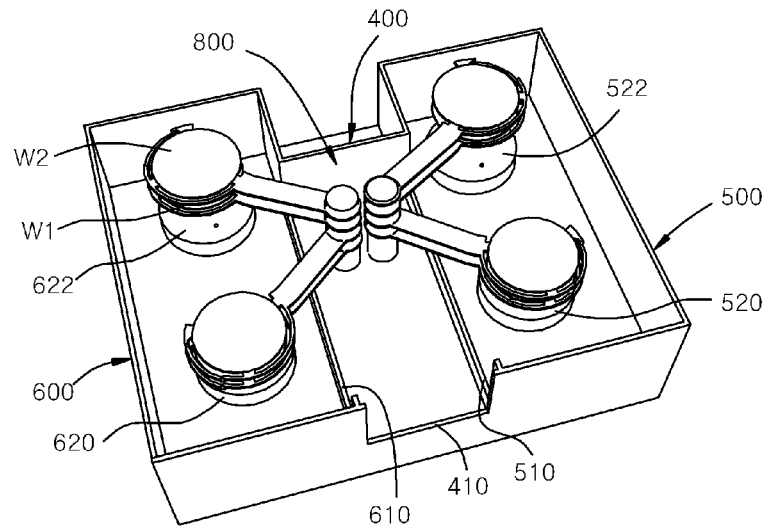
FIG. 11 illustrates an example in which a substrate transfer apparatus having two driving shafts is employed.

FIG. 11 illustrates an example in which a substrate transfer apparatus having two driving shafts is employed. Referring to FIG. 11, the substrate transfer apparatus 800 can be divided into a left part and a right part to be independently driven. In other words, the swivel plate arms of the first process chamber 500 to transfer the substrates and the swivel plate arms of the second process chamber 600 to transfer the substrates can be separately driven.

Figure 12:
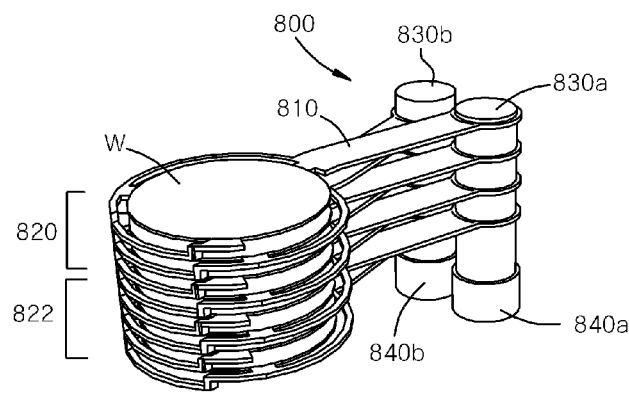
FIGS. 12 and 13 are views illustrating a modification of the substrate transfer apparatus having a spindle and a driving unit respectively divided into right parts and left parts.
Figure 13:
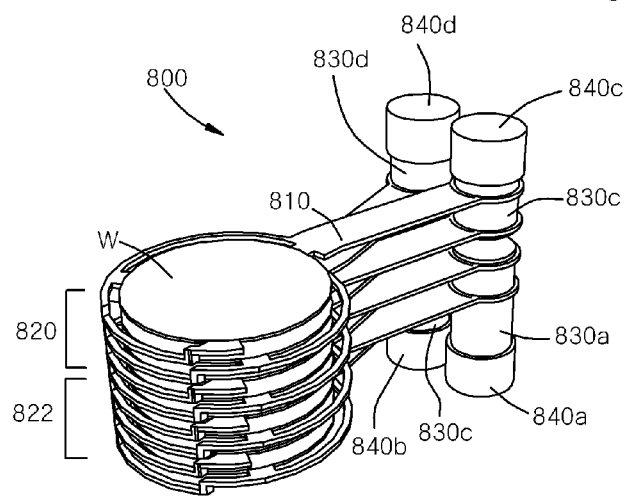

The above-structured substrate transfer apparatus, as illustrated in FIG. 12, includes first and second spindles 830a and 830b separated from each other, and first and second driving units 840a and 840b to independently drive the same. Moreover, as illustrated in FIG. 13, the above-structured substrate transfer apparatus may include first to fourth spindles 830a to 830d divided into upper parts and lower parts to be driven and first to fourth driving units 840a to 840d.

In addition, as illustrated in FIGS. 8, 9A, and 9B, the substrate transfer apparatus can be alternatively modified to include four or eight spindles 830a to 830d or 830a to 830h and four or eight driving units 840a to 840d or 840a to 840h. As such, various modifications of the substrate transfer apparatus 800 of the first and second process chambers 500 and 600 to transfer the substrates and the spindles and the driving units, which separately drive the swivel plate arms 810 to load and unload the substrates, are possible.

Embodiment 2

Figure 17:
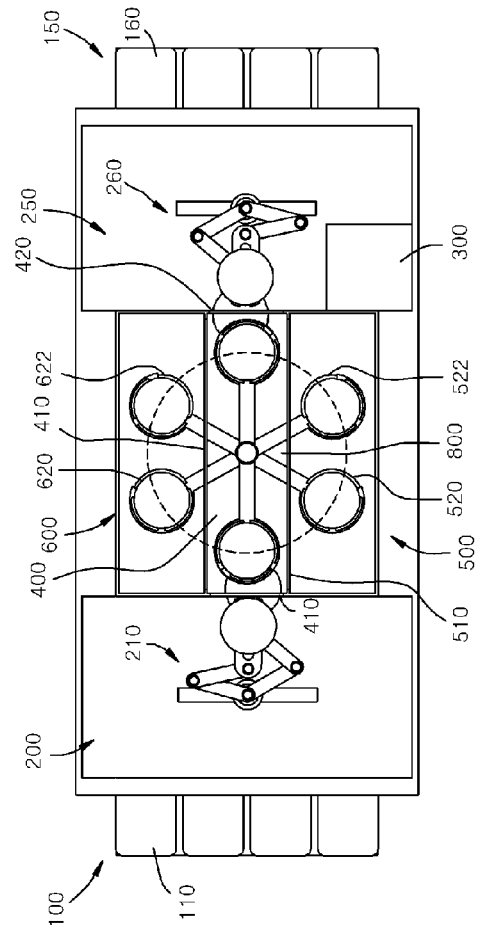
FIG. 17 is a plan view of a substrate processing system according to a second embodiment of the present invention.
Figure 18:
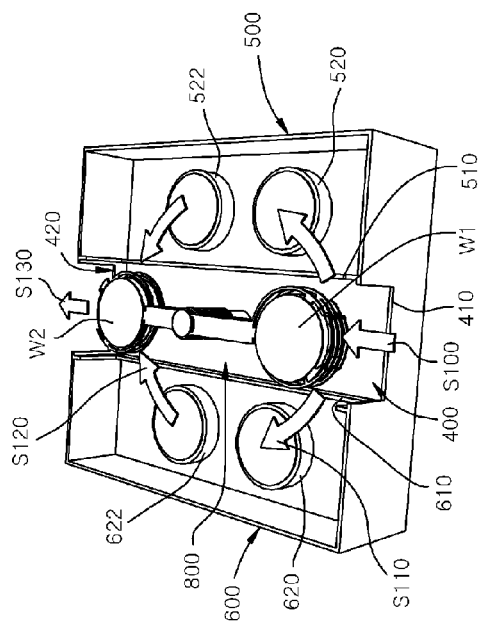
FIG. 18 is a view illustrating the flow of substrates transferred by the substrate transfer apparatus.

FIG. 17 is a plan view of a substrate processing system according to a second embodiment of the present invention and FIG. 18 is a view illustrating the flow of substrates transferred by the substrate transfer apparatus.

Referring to drawings, the substrate processing apparatus according to the second embodiment of the present invention includes the same structure as the first embodiment, and further includes a load lock chamber 250 having an atmospheric pressure transfer robot 260 disposed and an index 150 in the rear side. A fourth substrate entrance 420 is further formed between the transfer chamber 400 and the rear load lock chamber 250. In the substrate processing system, the substrates before being processed are loaded to the front side and the processed substrates are unloaded to the rear side. Here, the rear load lock chamber 250 may include a cooling chamber 300 to cool the substrates. Arrows S100 to S130 in FIG. 18 indicate the flow of the substrates before being processed and the processed substrates performed by the substrate transfer apparatus 800 step by step.

Figure 19:
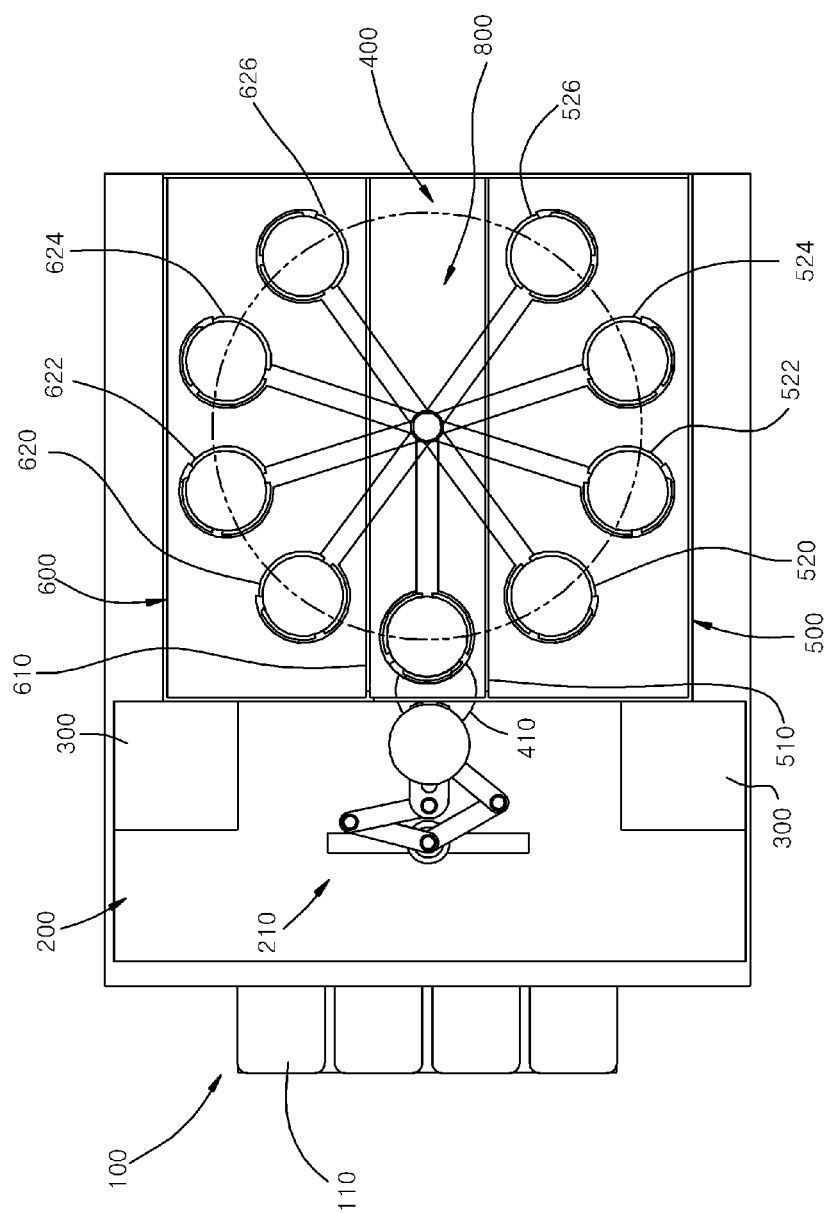
FIGS. 19 and 20 are views illustrating modifications of the substrate processing system according to the embodiment of the present invention.
Figure 20:
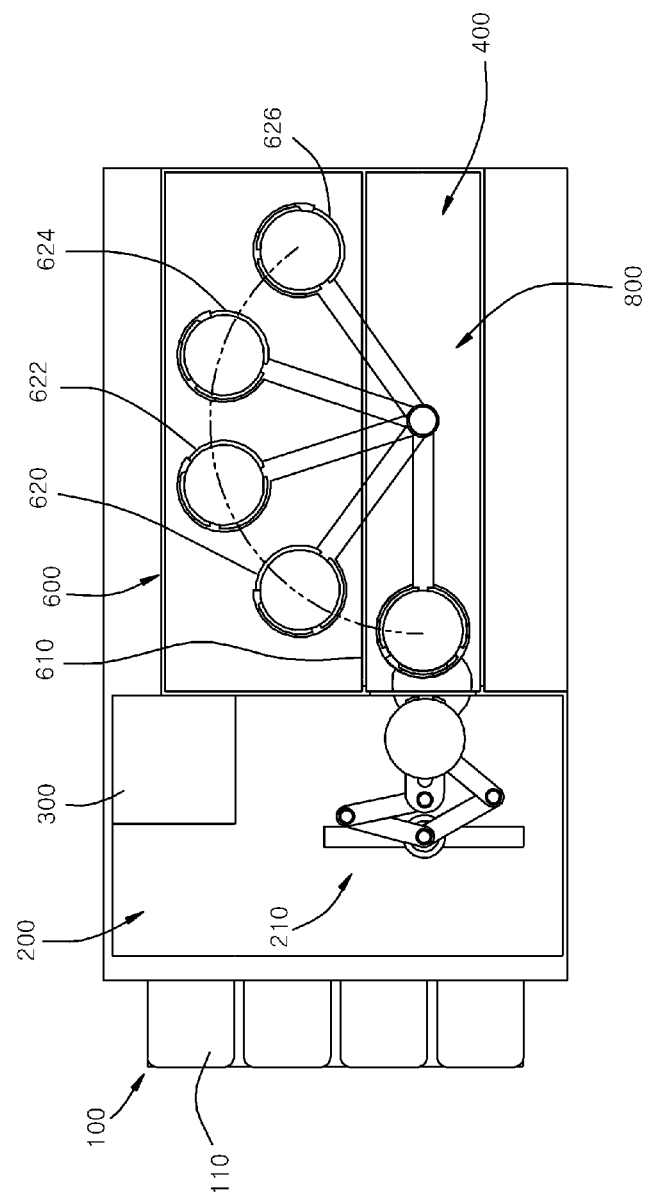

FIGS. 19 and 20 are views illustrating modifications of the substrate processing system according to the embodiment of the present invention.

As illustrated in FIG. 12, the first and second process chambers 500 and 600 respectively include four substrate supporting tables 520 to 526 and 620 to 626, and the substrate transfer apparatus 800 may include sixteen swivel plate arms to correspond to the same. Otherwise, as illustrated in FIG. 13, only the second process chamber 600 is provided without the first process chamber 500, and the substrate transfer apparatus 800 may include eight swivel plate arms. At least one cooling chamber 300 to cool the substrates may be provided to correspond to the number of the substrates to be processed.

Although the substrate processing system of the present invention is described to include a single layer of the process chamber in the above embodiment, a plurality of process chambers and transfer chambers can be configured by multi-layers. In the multi-layer structure, the substrate transfer apparatus provided in the transfer chambers may be driven independently or simultaneously.

Embodiment 3

Figure 21:
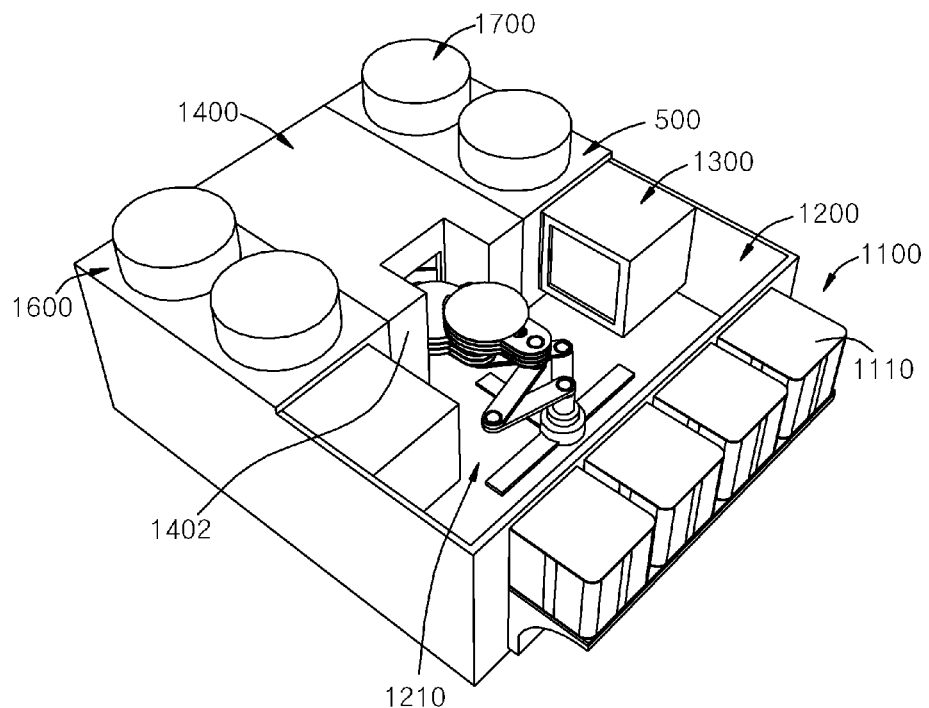
FIG. 21 is a view illustrating an overall structure of a substrate processing system according to a third embodiment of the present invention.
Figure 22:
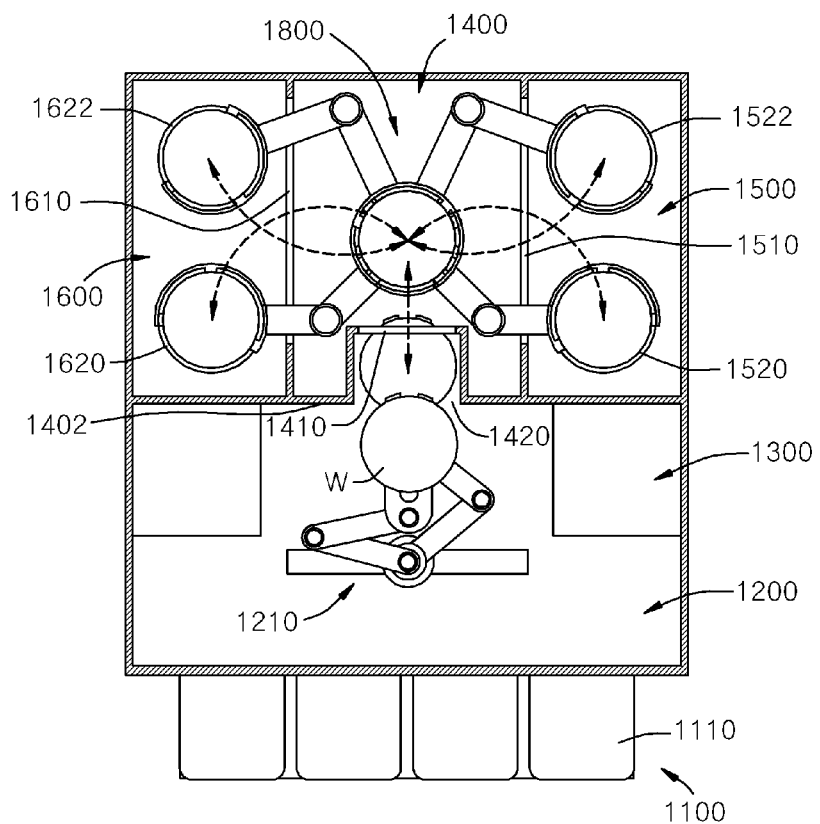
FIG. 22 is a plan view of the substrate processing system of FIG. 21.

FIG. 21 is a view illustrating an overall structure of a substrate processing system according to a third embodiment of the present invention and FIG. 22 is a plan view of the substrate processing system of FIG. 21.

Figure 14:
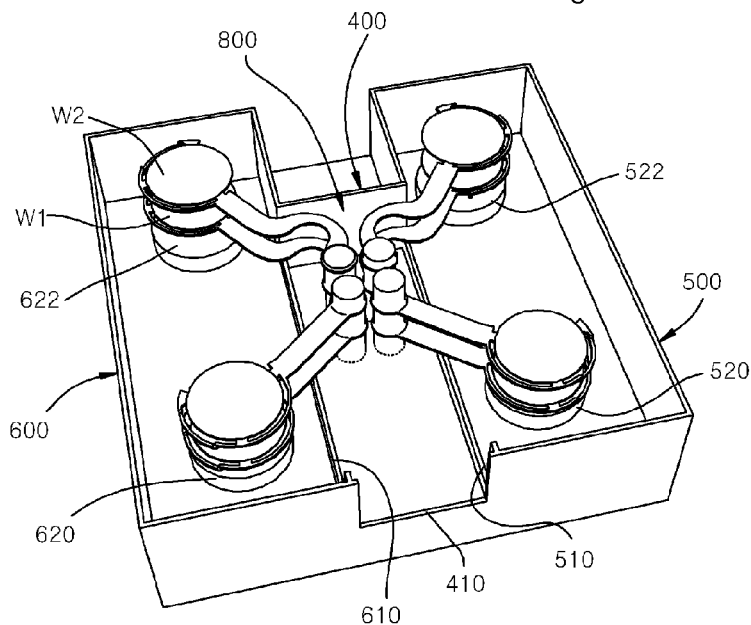
FIG. 14 is a view illustrating a substrate transfer apparatus to employ four separate spindles.
Figure 15:
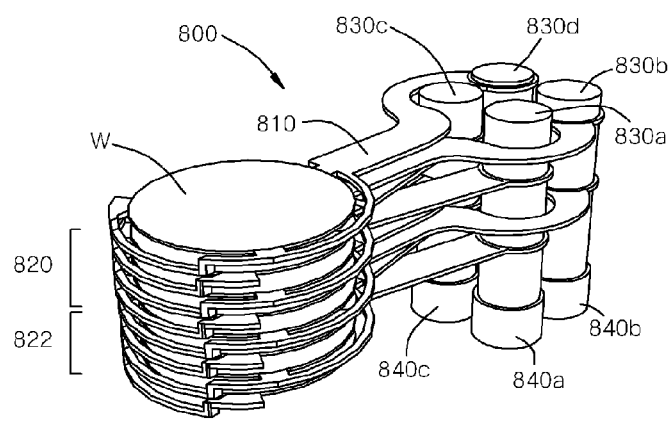
FIGS. 15 and 16 are views illustrating a modification of the substrate transfer apparatus having a plurality of spindles and driving units.
Figure 16:
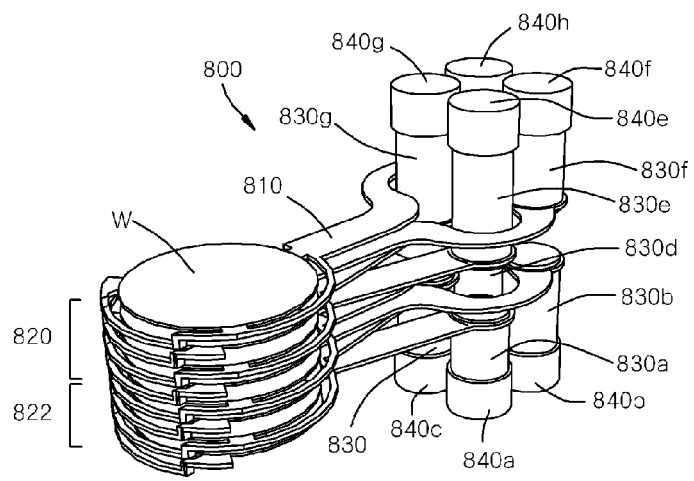

Referring to FIGS. 14 and 15, the substrate transfer apparatus according to this embodiment of the present invention includes first and second process chambers 1500 and 1600 and a transfer chamber 1400 disposed therebetween. An index 1100 in which a plurality of carriers 1110 are mounted is installed in front of a load lock chamber 1200. The index 1100 is referred to as an equipment front end module (hereinafter, referred to as 'EFEM') and is referred to as including the load lock chamber on occasion. If necessary, the load lock chamber 1200 may include a cooling chamber 1300 for cooling the processed substrates.

The load lock chamber 1200 includes an atmospheric pressure transfer robot 1210 operated under the atmospheric pressure. The atmospheric pressure transfer robot 1210 transfers substrates between the transfer chamber 1400 and the index 1100. The atmospheric pressure transfer robot 1210 operates to transfer substrates W between the carriers 1110 and the transfer chamber 1400. The atmospheric pressure transfer robot 1210 is implemented by a robot including a double arm structure with four end effectors to take four substrates W out of the carrier 1210 and to put the same into the transfer chamber 1400. The atmospheric pressure transfer robot 1210 can ascend and descend. Various robots used for common semiconductor manufacturing processes as well as the double arm type robot of this embodiment of the present invention may be used as the atmospheric pressure transfer robot 1210. For example, robots having various structures such as a robot having a blade type arm to handle eight substrates W with one arm, a robot including four or more arms, and a combination of the above-mentioned robots may be used.

Respective two of substrate supporting tables 1520, 1522, 1620, and 1622 are provided in first and second process chambers 1500 and 1600 in the front end, in the rear end, and on respective paths where the swivel plate arms of a substrate transfer apparatus 1800 swivel.

The first and second process chambers 1500 and 1600 include a plasma source 1700 as vacuum chambers to perform a predetermined plasma processing process. The first and second process chambers 1500 and 1600 may be configured to perform various substrate processing operations. For example, the first and second process chambers 500 and 600 may be ashing chambers to remove photoresist using plasma, chemical vapor deposition (CVD) chambers to depose insulating layers, etch chambers to etch apertures or openings in the insulating layers in order to form interconnection structures, physical vapor deposition (PVD) chambers to depose barrier layers, or PVD chambers to depose metal layers.

The substrates W processed by the substrate processing system according to this embodiment of the present invention are typically wafer substrates for manufacturing a semiconductor circuit or glass substrates for manufacturing an LCD. A plurality of processing systems may be required in order to perform all of the processes required for completely manufacturing an integrated circuit or a chip other than the substrate processing system according to this embodiment of the present invention. However, in order to clarify the present invention, a common structure or structures that can be understood by those skilled in the art are omitted.

The substrate processing system according to this embodiment of the present invention includes the transfer chamber 1400 located in the center and the first and second process chambers 1500 and 1600 respectively disposed at the lateral sides of the transfer chamber 1400. At least two substrate supporting tables 1520, 1522, 1620, and 1622 are respectively installed in the first and second process chambers 1500 and 1600. The transfer module 1400 includes the substrate transfer apparatus 1800.

A first substrate entrance 1510 is formed between the transfer chamber 1400 and the first process chamber 1500, and a second substrate entrance 1610 is formed between the transfer chamber 1400 and the second process chamber 1600. A third substrate entrance 1410 is formed between the transfer chamber 1400 and the load lock chamber 1200. The first to third substrate entrances 1510, 1610, and 1410 are opened and closed by slit valves (not shown). Especially, a front side 1402 of the transfer chamber 1400 has a shape in which the third entrance 1410 is depressed inwardly. According to this structural feature, since the internal area of the transfer chamber 1400 can is reduced, the scale of a vacuum system required for maintaining the transfer chamber 1400 in a vacuum state can be also reduced.

The exchange of the substrates before and after being processed in the transfer chamber 1400 performed by the atmospheric pressure transfer robot 1210 is carried out under the atmospheric pressure where the first and second substrate entrances 1510 and 1610 are closed and the third substrate entrance 1410 is opened. On the other hand, the exchange of the substrates before and after being processed performed, between the first and second process chambers 1500 and 1600 and the transfer chamber 1400 by the substrate transfer apparatus 1800, is carried out in a vacuum state where the third substrate entrance 1410 is closed and the first and second substrate entrances 1510 and 1610 are opened.

Figure 23:
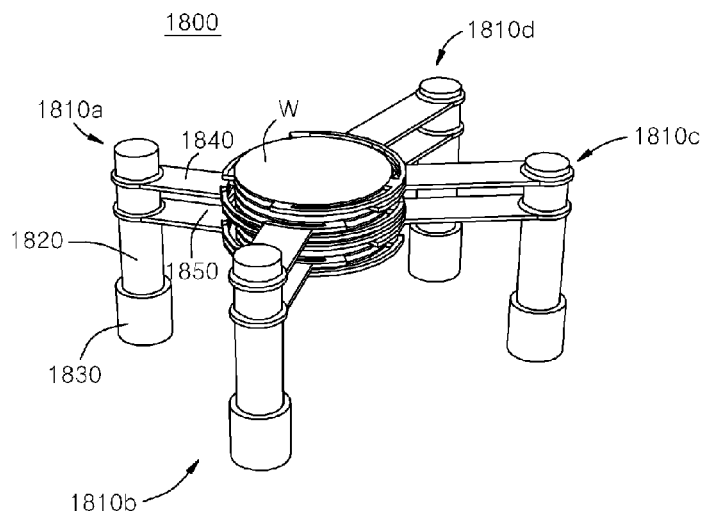
FIG. 23 is a perspective view of a substrate transfer apparatus installed in a transfer chamber.
Figure 24:
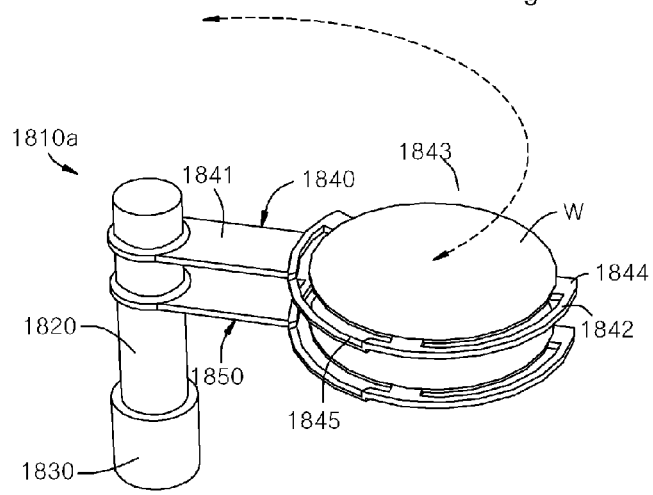
FIGS. 24 to 27 are perspective views illustrating the first to fourth transfer members of the substrate transfer apparatus.
Figure 25:
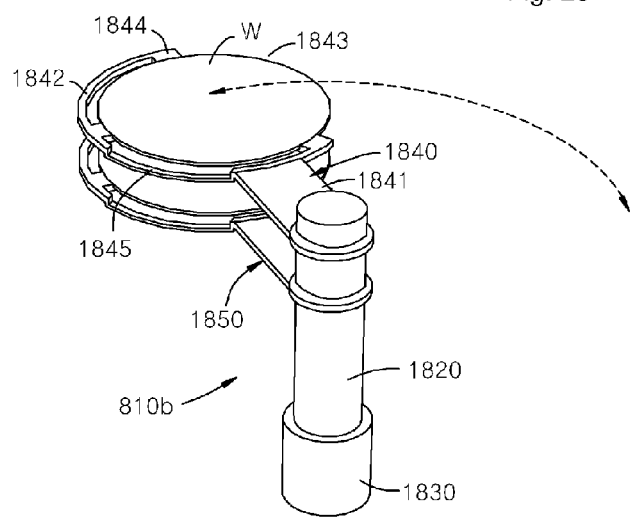

FIG. 23 is a perspective view of a substrate transfer apparatus installed in a transfer chamber, and FIGS. 24 to 27 are perspective views illustrating the first to fourth transfer members of the substrate transfer apparatus.

Referring to FIGS. 15 to 17D, the substrate transfer apparatus 1800 includes the first to fourth transfer members 1810a, 1810b, 1810c, and 1810d scattered and disposed on the verge of the transfer chamber 1400.

The first to fourth transfer members 1810a, 1810b, 1810c, and 1810d simultaneously receive four substrates to a standby position (See FIG. 28) of the transfer chamber 1400 through the third substrate entrance 1410 and transfer the four substrates to the upper sides of the substrate supporting tables 1520, 1522, 1620, and 1622 which are installed in the first and second process chambers 1500 and 1600, and receive respective substrates from the upper sides of the substrate supporting tables 1520, 1522, 1620, and 1622 to concentrately transfer the same to the standby position of the transfer chamber 1400.

Each of the first to four transfer members 1810a, 1810b, 1810c, and 1810d includes a driving unit 1830 to provide a rotational force, a spindle 1820 connected to the driving unit 1830, and two swivel plate arms 1840 and 1850 mounted on the spindle 1820. The two swivel plate arms 1840 and 1850 may be divided into a loading arm 1840 and an unloading arm 1850. In this case the unloading arm 1850 is preferably disposed lower than the loading arm 1840.

Figure 28:
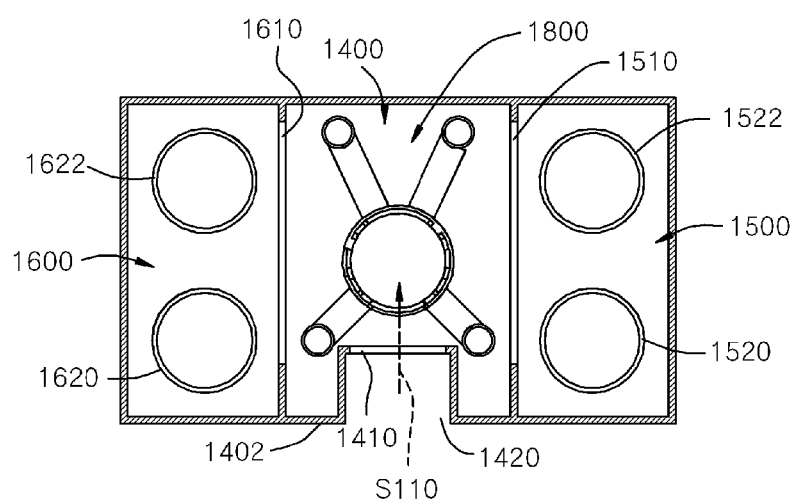
FIGS. 28 to 31 are views sequentially illustrating substrate exchanging operations performed by the substrate transfer apparatus.

As illustrated, the substrate transfer apparatus 1800 includes eight swivel plate arms 1840 and 1850 to make total four pairs. The swivel plate arms 1840 and 1850, as illustrated in FIG. 28, can swivel, ascend, and descend in order to move between the standby positions where the swivel plate arms 1840 and 1850 are vertically aligned with a single aligning line for the reception and transfer of the substrates from and to the atmospheric pressure robot 1210, and a scattering position where the swivel plate arms 1840 and 1850 are unfolded upward the scattered substrate supporting tables. The loading arms 1840 and the unloading arms 1850 make pairs to operate.

The first transfer member 1810a includes two swivel plate arms 1840 and 1850 to load/unload the substrates on/from the substrate supporting table 1622 of the second process chamber 1600 at the standby position, and the second transfer member 1810b includes two swivel plate arms 1840 and 1850 to load/unload the substrates on/from the substrate supporting table 1620 of the second process chamber 1600 at the standby position. The third transfer member 1810c includes two swivel plate arms 1840 and 1850 to load/unload the substrates on/from the substrate supporting table 1520 of the first process chamber 1500 at the standby position, and the fourth transfer member 1810d includes two swivel plate arms 1840 and 1850 to load/unload the substrates on/from the substrate supporting table 1522 of the first process chamber 1500 at the standby position.

On the other hand, the first to fourth transfer members 1810a, 1810b, 1810c, and 1810d have different heights to avoid collision with each other when the first to fourth transfer members 1810a, 1810b, 1810c, and 1810d are gathered at the standby position, and may be alternately or sequentially arranged.

Although not shown in the drawing, the driving unit 1830 includes an electric motor to generate a rotational force and a gear assembly to transmit the generated rotational force to the spindle 1820 such that the swivel plate arms 1840 and 1850 perform desired operations. Thus, the swivel plate arms 1840 and 1850 are mounted in the spindle 1820 and, as illustrated in FIGS. 15 and 17A to 17D, are symmetrically unfolded and folded at different radiuses of rotation about the transfer chamber 1400. In other words, the first and fourth transfer members 1810a and 1810d swivel symmetrically to each other and the second and third transfer members 1810b and 1810c swivel symmetrically to each other.

As illustrated in FIGS. 24 to 27, the swivel plate arms 1840 and 1850 of the first to fourth transfer members 1810a, 1810b, 1810c, and 1810d include horseshoe-shaped end effectors 1842 having openings 1843 with opened sides and a plurality of supports 1844 whose upper sides to which rims of the substrates are positioned. The openings 1843 are provided to allow lift pins installed in the substrate tables to enter and exit. The end effectors 1842 have entrance paths 1845 through which end effectors 1212 of the atmospheric pressure transfer robot 1210 enter and exit. The swivel plate arms 1840 and 1850 can be modified in other forms with the scope of the present invention.

The substrate processing system of the present invention can be modified by the following alternate embodiments.

FIGS. 23 through 27 are views illustrating an example in which a transfer member 1810a' having an extensible plate arm is employed.

Referring to FIGS. 23 through 27, the swivel plate arm 1840' includes first to third rod-antenna type extensible plate arms 1841-1, 1841-2, and 1841-3. The first extensible plate arm 1841-1 is a part to be connected to the spindle 1820, the second extensible plate arm 1841-2 is a part to be extended from the first extensible plate arm 1841-1, and the third extensible plate arm 1841-3 is a part to be extended from the second extensible plate arm 1841-2 and has an end to be connected to the end effector 1842.

Figure 33:
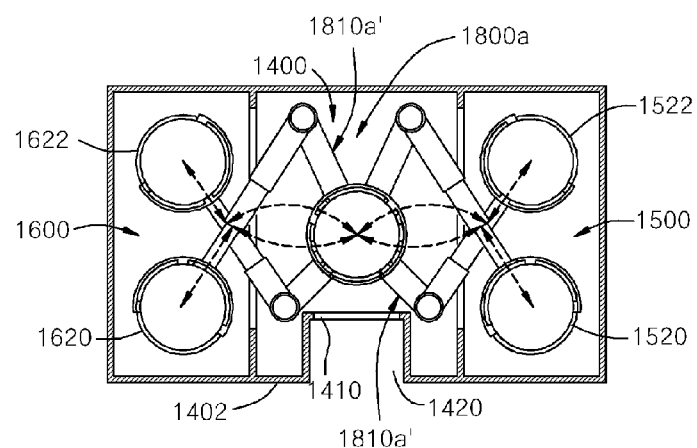
FIG. 33 is a view illustrating a modification of a substrate processing system to employ the substrate transfer apparatus having the transfer members illustrated in FIG. 32.

The transfer members 1810*a'* of the substrate transfer apparatus 1800 having the above-mentioned structure, as illustrated in FIG. 33, are operated such that each of the swivel plate arms 1840' swivels toward respective substrate supporting tables 1522, 1520, 1622, and 1620 from the standby position of the transfer chamber 1800*a* and after that the extensible plate arms 1841-1, 1841-2, and 1841-3 are withdrawn step by step to position the end effector 1842 in the upper sides of the substrate supporting tables. In other words, the transfer members 1810*a'* swivel in a state of shrinking the extensible plate arms 1841-1, 1841-2, and 1841-3 in order to reduce the radius of rotation, and extends to position the end effector 1842 at the substrate supporting table.

Due to such extensible structure, as illustrated in FIG. 33, the radiuses of rotation of the transfer members 1810*a'* of the substrate transfer apparatus 1800 can be reduced so that the overall area of the transfer chamber can be also reduced.

FIGS. 28 to 31 are views sequentially illustrating substrate exchanging operations performed by the substrate transfer apparatus.

Firstly, referring to FIG. 28, as indicated by an arrow S110, in a state where the first and second substrate entrances 1510 and 1610 are closed, substrates before being processed are transferred to the substrate transfer apparatus 1800 when the third substrate entrance 1410 is opened. When the transfer of the substrates is finished, the third substrate entrance 1410 is closed and the transfer chamber 1400 is switched to the same vacuum state as the interiors of the first and second process chambers 1500 and 1600. Absolutely, a pumping system for the vacuum state is provided in the system according to this embodiment of the present invention, but is omitted for convenience.

Next, as the lift pins (not shown) of the plurality of supporting tables 1520, 1522, 1620, and 1622 ascend, processed substrates are elevated to a predetermined height. In association with this operation, the first and second substrate entrances 1510 and 1610 are opened. At this time, the height of the elevated lift pins is different according to position of the corresponding transfer members where the substrates are transferred. Thus, the rotation of the swivel plate arms 1840 and 1850 for the loading/unloading does not interfere with the lift pins.

Figure 29:
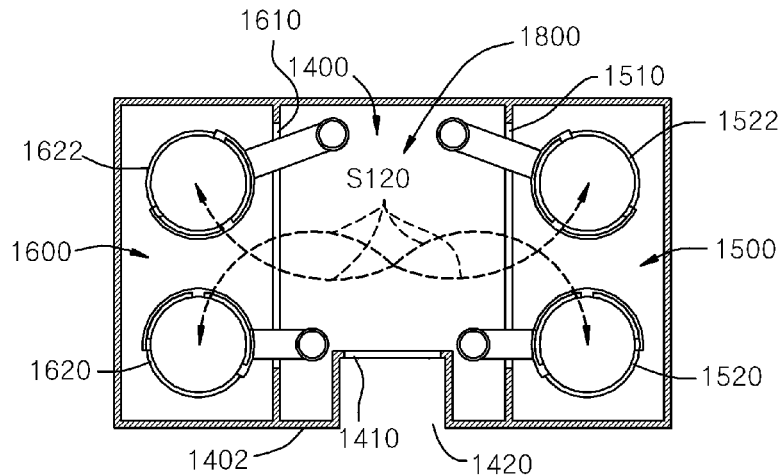
Figure 30:
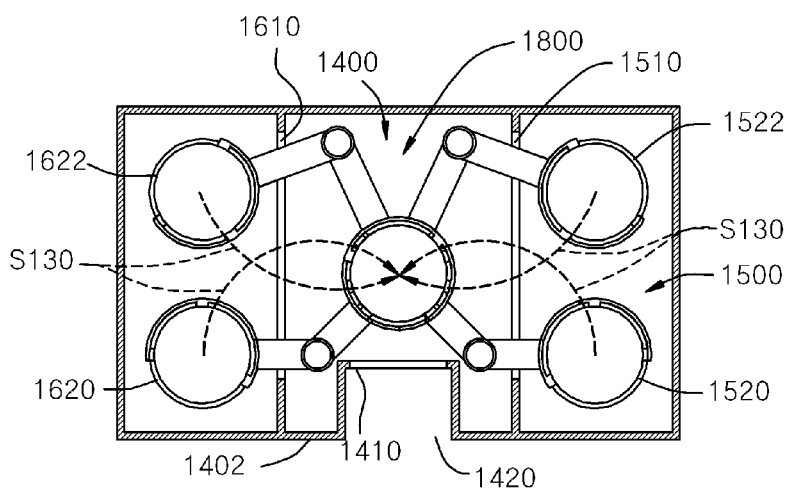

Continuously, as indicated by an arrow S120 in FIG. 29, the swivel plate arms 1840 and 1850 of the first to fourth transfer members 1810*a* to 1810*d* of the substrate transfer apparatus 1800 swivel toward the upper sides of the respective corresponding substrate supporting tables and are unfolded. At this time, the processed substrates are transferred from the lift pins to the unloading arms 1850 of the first to fourth transfer members 1810*a* to 1810*d*. When the processed substrates is transferred, continuously, as indicated by an arrow S130 in FIG. 30, the unloading arms 1850 return to the central standby position as the initial position of the transfer chamber 1400. The lift pins ascend again to receive the substrates before being processed from the loading arms 1840.

Figure 31:
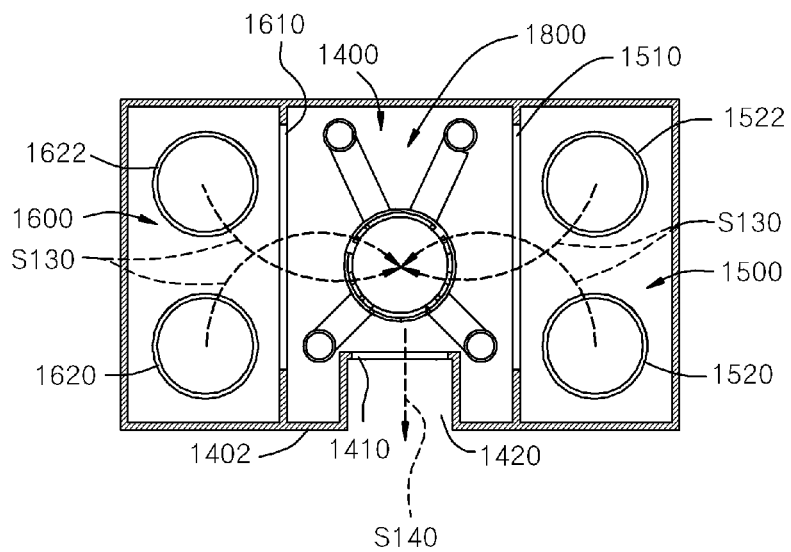

As indicated by an arrow S140 in FIG. 31, the loading arms 1840 also return to the initial position of the transfer chamber 1400. Simultaneously, the first and second substrate entrances 1510 and 1610 are closed again. The lift pins descend to place the substrates before being processed on the substrate supporting tables 1520, 1522, 1620, and 1622.

The transfer chamber 1400 is switched to the atmospheric pressure state and the third substrate entrance 1410 is opened.

The atmospheric pressure transfer robot 1210 of the load lock chamber 1200, as indicated by an arrow S150 in FIG. 31, receives the processed substrates from the unloading arms 1850 and exit from the transfer chamber 1400.

Such the sequential operations of exchanging the substrates S110 to S150 are continuously and simultaneously performed within a range where the prior and post operations do not interfere with each other in order to minimize time required to exchange the substrates. It can be understood that the operations S110 and S150 are simultaneously performed during the repeated exchange of the substrates. In other words, the exchange of the substrates is performed between the transfer chamber 1400 and the load lock chamber 1200 by which the processed substrates unloaded in the prior operation are exchanged with the substrates before being processed to be loaded simultaneously.

The unloaded processed substrates are transferred to the cooling chamber 1300 by the atmospheric pressure transfer robot 1210 and are cooled to be accumulated in the carriers 1110. Although the cooling chamber 1300 is separately provided in this embodiment of the present invention, if the transfer chamber 1400 performs the cooling function, the separate cooling chamber 1300 may be omitted. Alternatively, one of the first and second process chambers 1500 and 1600 may serve to as a cooling chamber. For example, it is possible to implement the first process chamber 1500 as a plasma chamber and the second process chamber 1600 as a cooling chamber. In this case, the first process chamber 1500 performs the plasma process of the substrates, the substrate transfer apparatus 1800 transfers the processed substrates from the first process chamber 1500 to the second process chamber 1600 to cool. The cooled substrates may be transferred from the second process chamber 1600 to the load rock chamber 1200.

As such, according to the substrate processing system in accordance with this embodiment of the present invention, in order to simultaneously process a plurality of substrates, the first and second process chambers 1500 and 1600 are arranged in parallel and the transfer chamber 1400 is positioned between the first and second process chambers 1500 and 1600. The substrate transfer apparatus 1800 is provided to enable the fast exchange of the substrates in this configuration, so that a great deal of substrates can be simultaneously processed and rapidly exchanged. In this embodiment, respective two substrates in the first and second process chamber 1500 and 1600, total four substrates can be simultaneously processed and exchanged in one process.

Although the substrate processing system of the present invention is described to include a single layer of the process chamber in the above embodiment, a plurality of process chambers and transfer chambers can be configured by multilayers. In the multi-layer structure, the substrate transfer apparatus provided in the transfer chambers may be driven independently or simultaneously.

Embodiment 4

Figure 34:
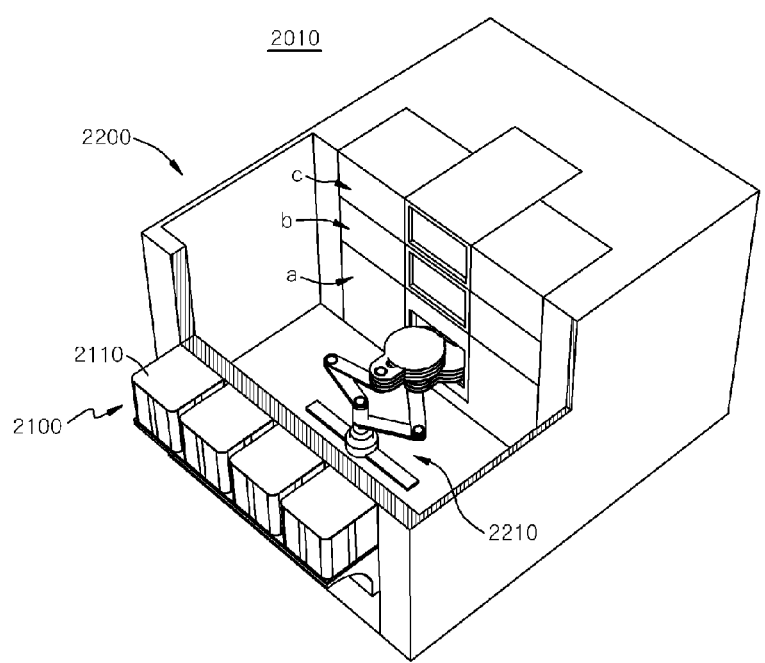
FIG. 34 is a view illustrating an overall structure of a substrate processing system according to a fourth embodiment of the present invention.
Figure 35:
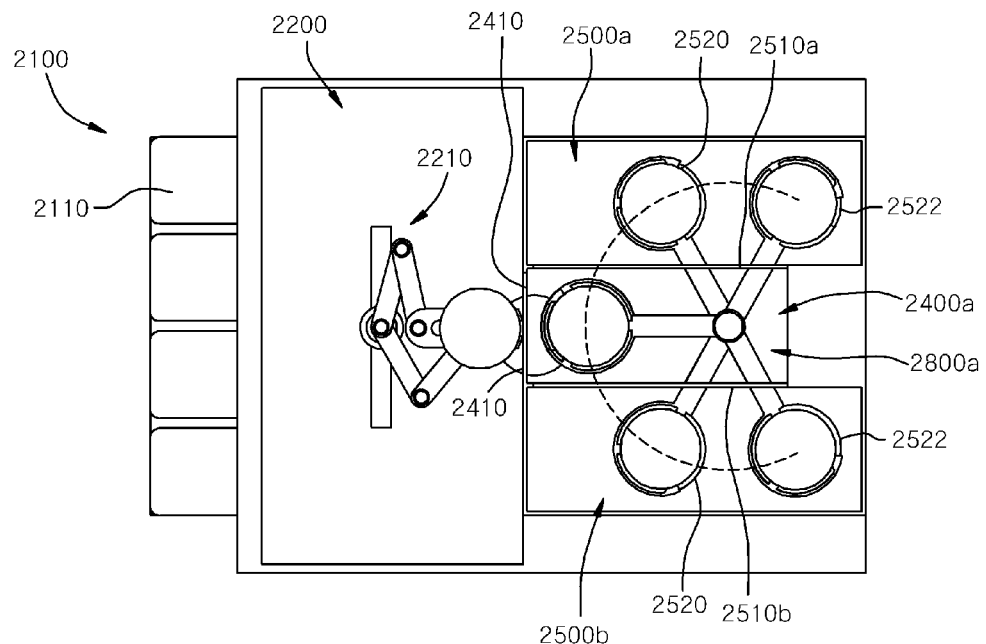
FIGS. 35 to 37 are plan views illustrating the substrate processing system whose first, second, and third processing groups are illustrated in FIG. 34.
Figure 36:
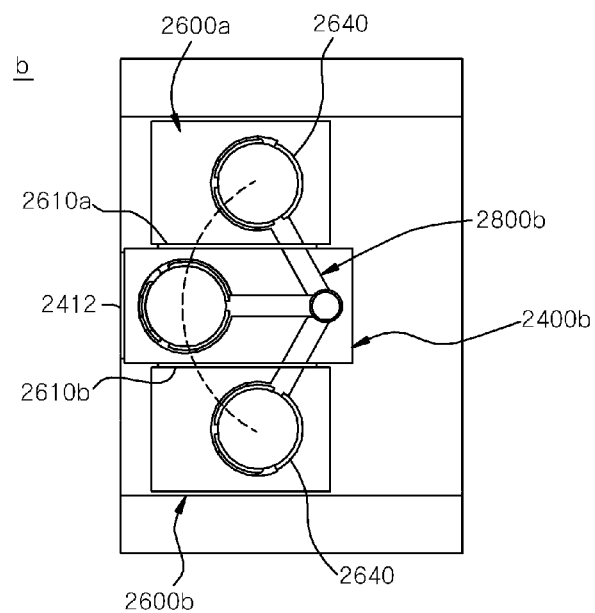
Figure 37:
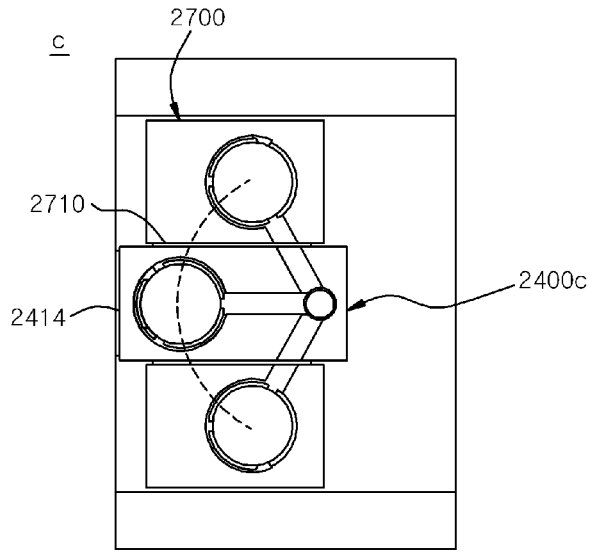

FIG. 34 is a view illustrating an overall structure of a substrate processing system according to a fourth embodiment of the present invention, and FIGS. 35 to 37 are plan views illustrating the substrate processing system whose first, second, and third processing groups are illustrated in FIG. 34.

Referring to FIGS. 21 to 22C, the substrate processing system according to this embodiment of the present invention includes a load lock chamber 2200 and first, second and third processing groups a, b, and c, which are disposed to be accumulated in multi-layers in the rear side of the load lock chamber 220.

An index 2100 in which a plurality of carriers 2110 are mounted is installed in front of a load lock chamber 2200. The index 2100 is referred to as an equipment front end module (hereinafter, referred to as 'EFEM') and is referred to as including the load lock chamber on occasion.

The load lock chamber 2200 includes an atmospheric pressure transfer robot 2210 operated under the atmospheric pressure. The atmospheric pressure transfer robot 2210 transfers substrates between first, second, and third transfer chambers 2400*a*, 2400*b*, and 2400*c* respectively corresponding to the processing groups and the index 2100. The atmospheric pressure transfer robot 2210 is implemented by a robot including a double arm structure with four end effectors to take four substrates W out of the carrier 2210 and to put the same into the first, second, and third transfer chambers 2400*a*, 2400*b*, and 2400*c* of the respective layers. The atmospheric pressure transfer robot 2210 can ascend and descend. Various robots used for common semiconductor manufacturing processes as well as the double arm type robot of this embodiment of the present invention may be used as the atmospheric pressure transfer robot 2210. For example, robots having various structures such as a robot having a blade type arm to handle eight substrates W with one arm, a robot including four or more arms, and a combination of the above-mentioned robots may be used.

As illustrated in FIGS. 21 to 22C, the first, second, and third processing groups a, b, and c are stacked in the multi-layers. The first processing group a positioned in the first layer includes first and second process chambers 2500*a* and 2500*b* to simultaneously process four substrates, the second processing group b positioned in the second layer includes first and second aligning chambers 2600*a* and 2600*b* to align substrates before being processed, and the third processing group c positioned in the uppermost layer includes a cooling chamber 2700 to cool the processed substrates.

As such, in the substrate processing system 2010 according to this embodiment of the present invention, in plan view, the aligning chambers are disposed to overlap with the cooling chamber in the process chambers so that a total bottom area of the substrate processing system can be reduced. Thus, manufacturing costs of a clean room can be reduced, and the direction changing operation of the atmospheric pressure robot 2210 can be eliminated during the transfer of the substrates from the second transfer chamber 2400*b* to the first transfer chamber 2400*a* and from the first transfer chamber 2400*a* to the third transfer chamber 2400*c*. Moreover, since the transfer distance is short, a rapid transfer of the substrates is enabled.

Referring to FIG. 35, the first processing group a positioned in the first layer includes the first and second process chambers 2500*a* and 2500*b* and the first transfer chamber 2400*a* disposed therebetween.

Respective two of substrate supporting tables 2520 and 2522 are provided in first and second process chambers 2500*a* and 2500*b* in the front and rear ends, and on respective paths where swivel plate arms of a first substrate transfer apparatus 2800*a* swivel.

The first and second process chambers 2500*a* and 2500*b* include a plasma source (not shown) as vacuum chambers to perform a predetermined plasma processing process.

A first substrate entrance 2510*a* is formed between the first transfer chamber 2400*a* and the first process chamber 2500*a*, and a second substrate entrance 2510*b* is formed between the first transfer chamber 2400*a* and the second process chamber 2500*b*. A third substrate entrance 2410 is formed between the first transfer chamber 2400*a* and the load lock chamber 2200. The first to third substrate entrances 2510*a*, 2510*b*, and 2410 are opened and closed by slit valves (not shown).

The exchange of the substrates before and after being processed in the first transfer chamber 2400*a* performed by the atmospheric pressure transfer robot 2210 is carried out under the atmospheric pressure where the first and second substrate entrances 2510*a* and 2510*b* are closed and the third substrate entrance 2410 is opened. On the other hand, the exchange of the substrates before and after being processed performed, between the first and second process chambers 2500*a* and 2500*b* and the first transfer chamber 2400*a* by the first substrate transfer apparatus 2800*a*, is carried out in a vacuum state where the third substrate entrance 2410 is closed and the first and second substrate entrances 2510*a* and 2510*b* are opened.

The first and second process chambers 2500*a* and 2500*b* may be configured to perform various substrate processing operations, for example, such as ashing chambers to remove photoresist using plasma, chemical vapor deposition (CVD) chambers to depose insulating layers, etch chambers to etch apertures or openings in the insulating layers in order to form interconnection structures, physical vapor deposition (PVD) chambers to depose barrier layers, or PVD chambers to depose metal layers.

The substrates W processed by the substrate processing system according to this embodiment of the present invention are typically wafer substrates for manufacturing a semiconductor circuit or glass substrates for manufacturing a liquid crystal display (LCD). A plurality of processing systems may be required in order to perform all of the processes required for completely manufacturing an integrated circuit or a chip other than the substrate processing system according to this embodiment of the present invention. However, in order to clarify the present invention, a common structure or structures that can be understood by those skilled in the art are omitted.

Figure 26:
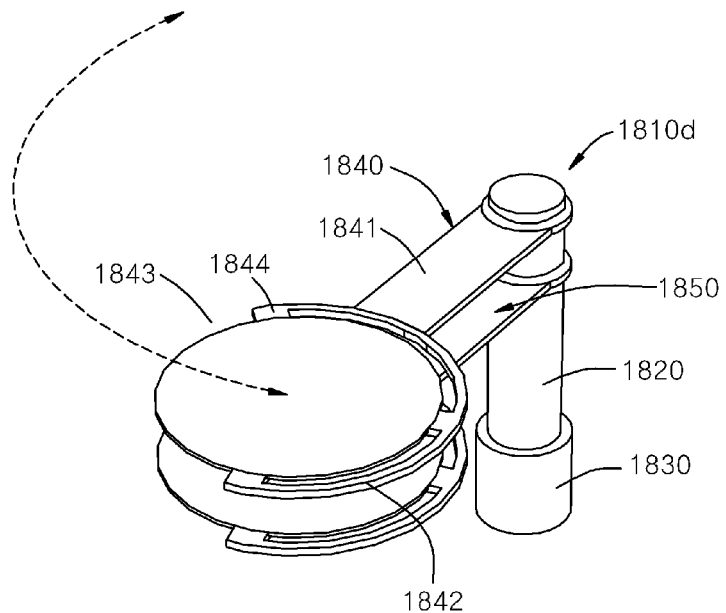
Figure 27:
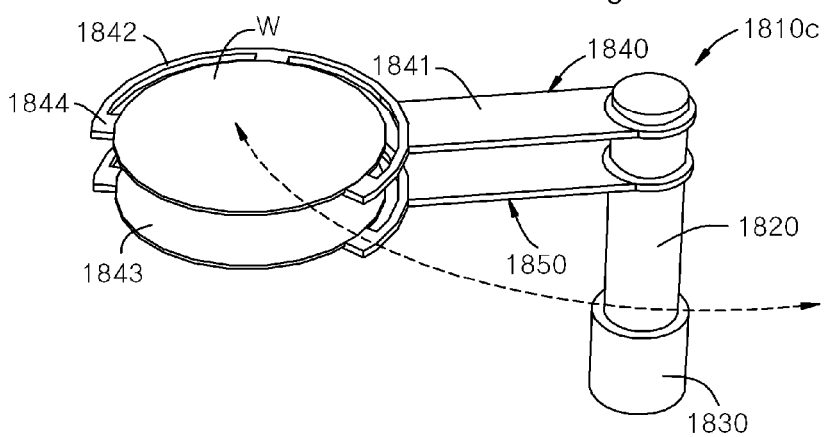

Referring to FIGS. 22B and 26, the second processing group b positioned in the second layer includes the first and second aligning chambers 2600*a* and 2600*b* and the second transfer chamber 2400*b* disposed therebetween.

The first and second aligning chambers 2600*a* and 2600*b* include respective one spin chuck 2640 disposed on paths where swivel plate arms of a second substrate transfer apparatus 2800*b* swivel.

Figure 47:
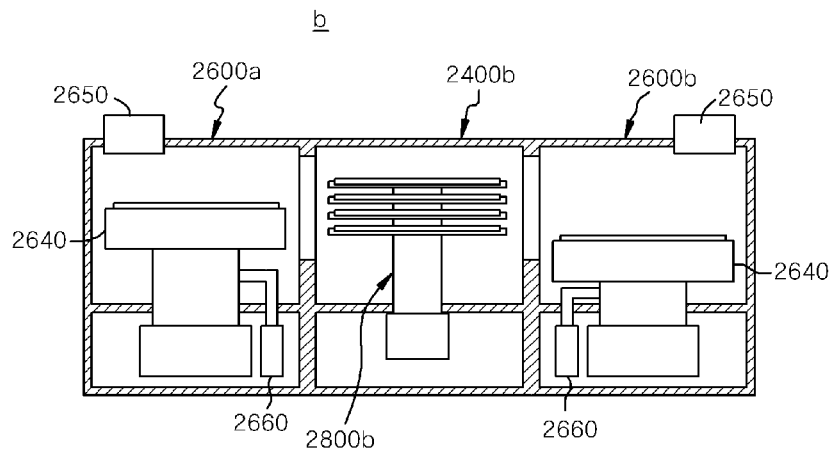
FIG. 47 is a front sectional view illustrating the second processing group.

The first and second aligning chambers 2600*a* and 2600*b* are chambers to align the substrates before performing process in the first and second process chamber 2500*a* and 2500*b*, and include substrate aligners having the spin chuck 2640, a detecting unit 2650, i.e., a sensor, and an elevator 2660 to adjust the height of the spin chuck 2640 according to the height of the swivel plate arms. The substrate aligner may be configured to swivel the spin chuck 2640 by placing the substrate thereon such that the detecting unit 2650 positioned in the upper side of the substrate detects a position of the substrate. Here, the detecting unit 2650 includes a charge coupled device (CCD) and a corresponding light source and detects the positions of the substrates. On the other hand, as illustrated in FIG. 47, according to the positions of the first and second swivel plate arms, the spin chuck 2640 of the first aligning chamber 2600*b* is disposed to be lower than the position of the spin chuck 2640 of the second aligning chamber 2600*a*.

A first substrate entrance 2610*a* is formed between the first transfer chamber 2400*a* and the first aligning chamber 2600*a*, and a second substrate entrance 2610*b* is formed between the second transfer chamber 2400b and the second aligning chamber 2600b. A third substrate entrance 2412 is formed between the second transfer chamber 2400b and the load lock chamber 2200. The first to third substrate entrances 2610a, 2610b, and 2412 are opened and closed by slit valves (not shown).

Referring to FIG. 37, the third processing group c positioned in the uppermost layer includes a third transfer chamber 2400c aligned with the second transfer chamber 2400b and a cooling chamber 2700 disposed at a side thereof. A first substrate entrance 2710 is formed between the third transfer chamber 2400c and the cooling chamber 2700, and a third substrate entrance 2414 is formed between the third transfer chamber 2400c and the load lock chamber 2200. The first and third substrate entrances 2710 and 2414 are opened and closed by slit valves (not shown).

As understood without description, the cooling chamber 2700 is a chamber to cool four substrates processed in the first and second process chambers, must include a cooling stage to which the four substrates are placed, and may further include a cooling gas supply to supply a cooling air to the substrates. Since the configuration and method of cooling the substrates are conventional and already known to those skilled in the art, the configuration and the method are omitted.

FIGS. 23A to 23C are perspective views of first, second, and third substrate transfer apparatuses provided in the first, second, and third transfer chambers.

Figure 38:
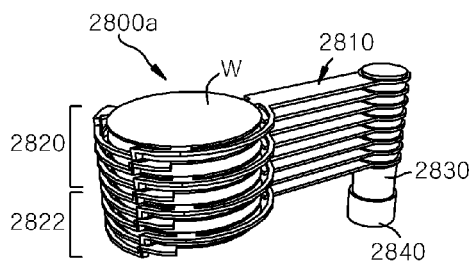
FIG. 38 is a perspective view illustrating a first substrate transfer apparatus provided in a first transfer chamber.

Firstly, referring to FIG. 38, the first substrate transfer apparatus 2800a includes a driving unit 2840 to provide a rotational force, a single spindle 2830 connected to the driving unit 2840, and eight swivel plate arms 2810 mounted in the spindle 2830.

The eight swivel plate arms 2810 include a plurality of first swivel plate arms to load/unload the substrates on/from the first process chamber 2500a and a plurality of second swivel plate arms to load/unload the substrates on/from the second process chamber 2500b. The first and second swivel plate arms are alternately arranged. However, the first and second swivel plate arms may be sequentially arranged. The swivel plate arms 2810 may be divided into loading arms 2820 and unloading arms 2822. In this case, the unloading arms 2822 are preferably arranged to be lower than the loading arms 2820. The loading arms 2820 and the unloading arms 2822 make pairs, and in an embodiment, as illustrated in the drawing, the eight swivel plate arms that make four pairs are provided. As illustrated in FIG. 35, the plurality of swivel plate arms 2810 are unfolded in the sector form, can swivel, ascend, and descend. The loading arms 2820 and the unloading arms 2822 make pairs to operate.

Although not shown in the drawing, the driving unit 2840 includes an electric motor to generate a rotational force and a gear assembly to transmit the generated rotational force to the spindle 2830 such that the plurality of swivel plate arms 2810 perform desired operations. Thus, the plurality of swivel plate arms 2810 are mounted in the spindle 2830 and, as illustrated in FIG. 35, are symmetrically unfolded in the sector form and folded at different radiuses of rotation about the first transfer chamber 2400a.

Although the substrate processing system of the present invention is described to include a single spindle, the substrate processing system may include spindles installed to the lateral sides thereof.

Figure 39:
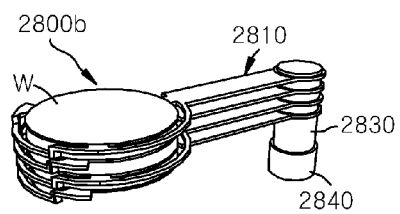
FIG. 39 is a perspective view illustrating a second substrate transfer apparatus installed in a second transfer chamber.

FIG. 39 is a perspective view illustrating the second substrate transfer apparatus installed in the second transfer chamber.

Referring to FIG. 39, the second substrate transfer apparatus 2800b, like the first substrate transfer apparatus 2800a, includes a driving unit 2840 to provide a rotational force, a single spindle 2830 connected to the driving unit 2840, and four swivel plate arms 2810 mounted in the spindle 2830. The second substrate transfer apparatus 2800b may include a plurality of driving units and a plurality of spindles connected to the respective driving units such that the four swivel plate arms 2810 can swivel independently.

The four swivel plate arms 2810 include first two swivel plate arms, disposed in the lower side, to load/unload the substrates on/from the first aligning chamber 2600a and second two swivel plate arms to load/unload the substrates on/from the second aligning chamber 2600b. The first and second swivel plate arms are sequentially arranged. However, the first and second swivel plate arms may be alternately arranged. As illustrated in FIG. 47, according to the positions of the first and second swivel plate arms, the spin chuck 2640 of the first aligning chamber 2600b is disposed to be lower than the spin chuck 2640 of the second aligning chamber 2600a.

Figure 40:
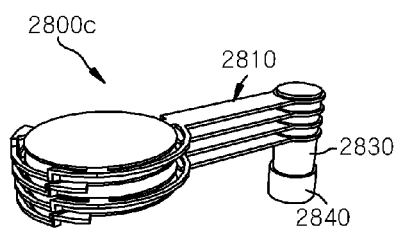
FIG. 40 is a perspective view illustrating a third substrate transfer apparatus installed in a third transfer chamber.

FIG. 40 is a perspective view illustrating a third substrate transfer apparatus installed in the third transfer chamber. Referring to FIG. 40, the third substrate transfer apparatus 2800c, like the first substrate transfer apparatus 2800a, includes a driving unit 2840 to provide a rotational force, a single spindle 2830 connected to the driving unit 2840, and four swivel plate arms 2810 mounted in the spindle 2830. The four swivel plate arms 2810 are for loading/unloading the substrates on/from the cooling chamber 2700.

Although not shown in the drawing, the first substrate transfer apparatus may include upper and lower spindles to which the loading arms 2820 and the unloading arms 2822 are separately mounted and a driving unit with upper and lower driving units to drive the upper and lower spindles.

Figure 41:
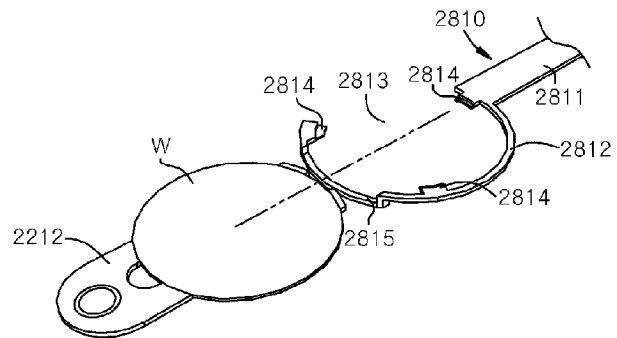
FIG. 41 is a perspective view illustrating a structure of a swivel plate arm.

FIG. 41 is a perspective view illustrating a structure of a single swivel plate arm.

Referring to FIG. 41, the plurality of swivel plate arms 2810, installed in the first, second, and third substrate transfer apparatuses 2800a, 2800b, and 2800c, include horseshoe-shaped end effectors 2812 having openings 2813 with opened sides and a plurality of supports 2814 whose upper sides to which rims of the substrates are positioned. The openings 2813 are provided to allow lift pins installed in the substrate tables to enter and exit. The end effectors 2812 have entrance paths 2815 through which end effectors 2212 of the atmospheric pressure transfer robot 210 enter and exit. The swivel plate arms 2810 can be modified in other forms with the scope of the present invention.

FIGS. 42 to 46 are views sequentially illustrating substrate exchanging operations performed by the first substrate transfer apparatus.

Figure 42:
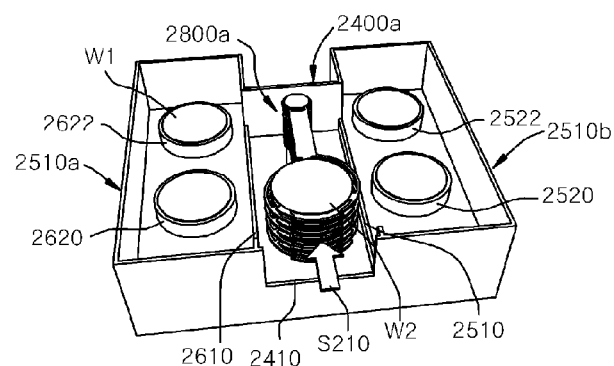
FIGS. 42 to 46 are views sequentially illustrating substrate exchanging operations performed by the first substrate transfer apparatus.

Firstly, referring to FIG. 42, as indicated by an arrow S210, in a state where the first and second substrate entrances 2510a and 2510b are closed, substrates W2 before being processed are transferred to the substrate transfer apparatus 2800a when the third substrate entrance 2410 is opened. When the transfer of the substrates W2 is finished, the third substrate entrance 2410 is closed and the first transfer chamber 2400a is switched to the same vacuum state as the interiors of the first and second process chambers 2500a and 2500b. Absolutely, a pumping system for the vacuum state is provided in the system according to this embodiment of the present invention, but is omitted for convenience.

Figure 43:
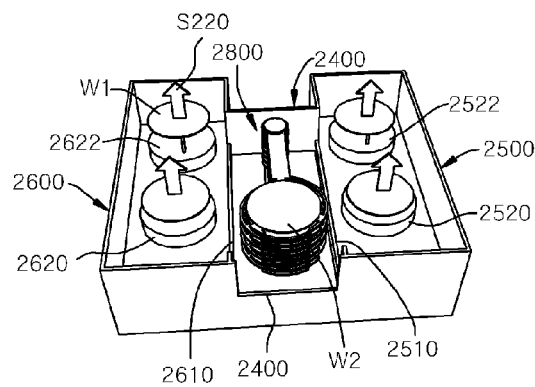

Next, as indicated by an arrow S220 in FIG. 43, when the lift pins of the plurality of supporting tables 2520 and 2522 ascend, processed substrates W1 are elevated to a predetermined height. In association with this operation, the first and second substrate entrances 2510a and 2510b are opened. At this time, the height of the elevated lift pins of the front substrate supporting table 2520 is relatively lower than that of the lift pins of the rear substrate supporting tables 2522. Thus, the rotation of the loading arms 2820 for the loading/unloading does not interfere with the lift pins.

Figure 44:
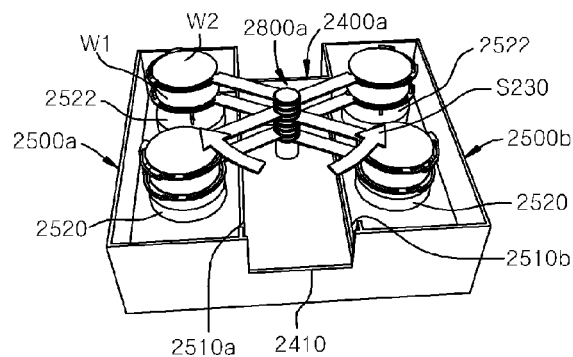
Figure 45:
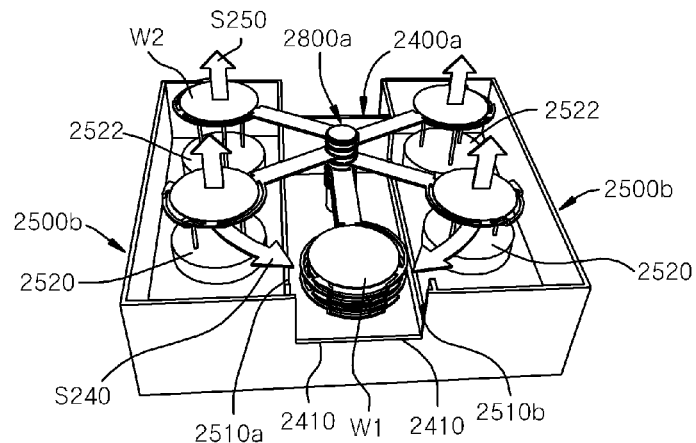

Continuously, as indicated by an arrow S230 in FIG. 44, the loading arms 2820 and the unloading arms 2822 of the first substrate transfer apparatus 2800a to make pairs symmetrically swivel and are unfolded in the sector form. At this time, the processed substrates W1 are transferred from the lift pins to the unloading arms 2822. When the processed substrates W1 is transferred, continuously, as indicated by an arrow S240 in FIG. 45, the unloading arms 2822 return to the initial position of the first transfer chamber 2400a. As indicated by an arrow S250, the lift pins ascend again to receive the substrates W2 before being processed from the loading arms 2820.

Figure 46:
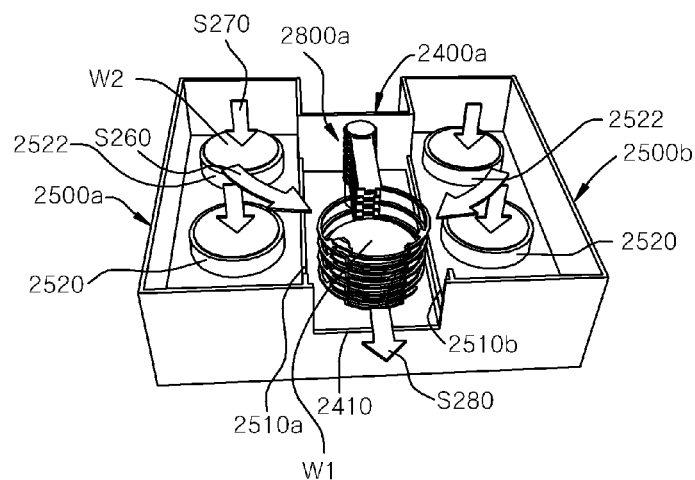

As indicated by an arrow S260 in FIG. 46, the loading arms 2820 also return to the initial position of the first transfer chamber 2400a. Simultaneously, the first and second substrate entrances 2510a and 2510b are closed again. As indicated by an arrow S270, the lift pins descend to place the substrates W2 before being processed on the substrate supporting tables 2520 and 2522.

The first transfer chamber 2400a is switched to the atmospheric pressure state and the third substrate entrance 2410 is opened. The atmospheric pressure transfer robot 2210 of the load lock chamber 2200, as indicated by an arrow S280 in FIG. 46, receives the processed substrates W1 from the unloading arms 2822 and exit from the first transfer chamber 2400a.

Such the sequential operations of exchanging the substrates S210 to S280 are continuously and simultaneously performed within a range where the prior and post operations do not interfere with each other in order to minimize time required to exchange the substrates. It can be understood that the operations S210 and S280 are simultaneously performed during the repeated exchange of the substrates. In other words, the exchange of the substrates is performed between the first transfer chamber 2400a and the load lock chamber 2200 by which the processed substrates unloaded in the prior operation are exchanged with the substrates before being processed to be loaded simultaneously.

Figure 48:
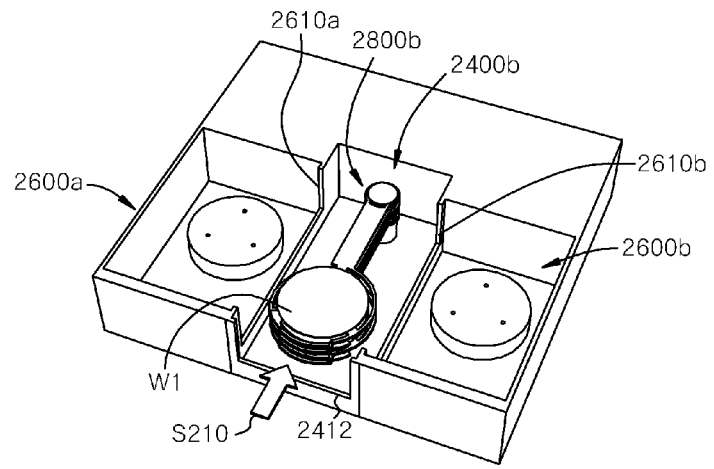
FIGS. 48 to 50 are views sequentially illustrating substrate exchanging performed by the second substrate transfer apparatus.
Figure 49:
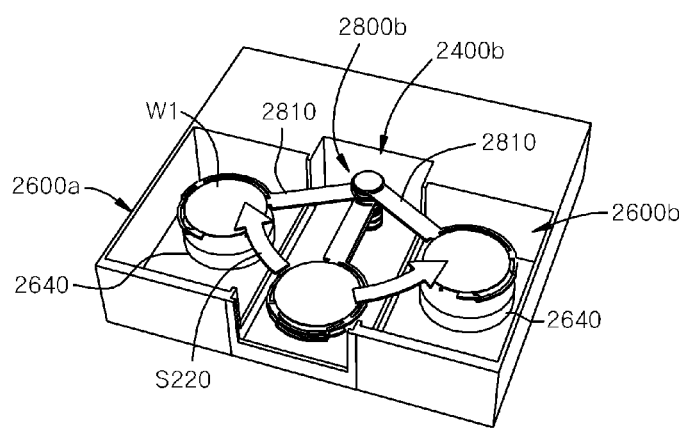
Figure 50:
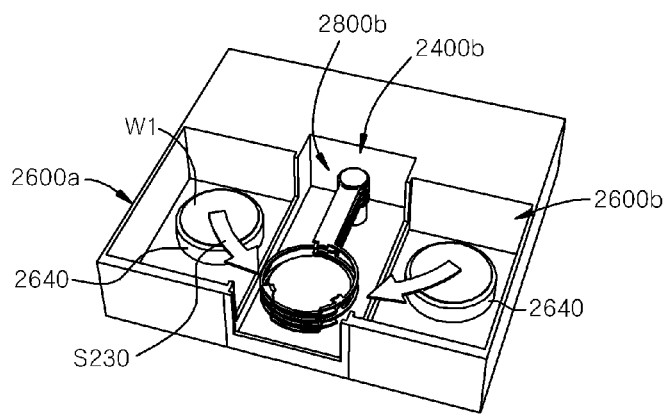

FIGS. 48 to 50 are views sequentially illustrating substrate exchanging performed by the second substrate transfer apparatus.

Firstly, referring to FIG. 48, as indicated by an arrow S210, substrates W1 before being processed are transferred to the substrate transfer apparatus 2800b when the third substrate entrance 2412 is opened. When the transfer of the substrates is finished, the third substrate entrance 2412 is closed and simultaneously the first and second substrate entrances 2610a and 2610b are opened. Continuously, as indicated by an arrow S220 in FIG. 49, one of the first swivel plate arms and one of the second swivel plate arms of the second substrate transfer apparatus 2800b symmetrically swivel and are unfolded to place the substrates W1 on the corresponding spin chucks 2640, and as indicated by an arrow S230 in FIG. 50, return to the initial positions. When the alignment of the substrates in the first and second aligning chambers 2600a and 2600b is finished, the alignment of the rest two substrates is carried out like the above-mentioned operations. When the two alignments of the four substrates are finished, the aligned substrates are transferred from the second transfer chamber 2400b to the first transfer chamber 2400a by the atmospheric pressure transfer robot 2210.

The atmospheric pressure transfer robot 2210 can transfer the substrates from the second transfer chamber 2400b to the first transfer chamber 2400a in a state of adjusting the height directly after taking the substrates from the second transfer chamber 2400b. In other words, since the third substrate entrances 2410 and 2412 of the first and second transfer chambers 2800a, 2800b are aligned with each other, the atmospheric pressure transfer robot 2210 can rapidly transfer the substrates from the second transfer chamber 2400b to the first transfer chamber 2400a without the direction change.

Meanwhile, the substrates processed in the first and second process chambers 2500a and 2500b are transferred to the third transfer chamber 2400c by the atmospheric pressure transfer robot 2210. In this operation, the atmospheric pressure transfer robot 2210 can rapidly transfer the substrates from the first transfer chamber 2400a to the third transfer chamber 2400c without the direction change. The substrates are transferred to and cooled in the cooling chamber 2700 by the third substrate transfer apparatus 2800c installed in the transfer chamber 2400c, and are taken out and accumulated in the carrier 2100 by the atmospheric pressure transfer robot 2210.

In this embodiment, since the four substrates W are simultaneously processed in the first and second process chambers 2500a and 2500b, twenty-four substrates W are simultaneously cooled in the cooling chamber 2700. However, time for the cooling of the substrates may be longer than time required for processing the substrates. In this case, by considering entire efficiency, it is considerable to dispose the cooling chambers 2700 to the lateral sides of the third transfer chamber 2400c.

The substrate processing system can be modified by the following alternative embodiments.

Figure 51:
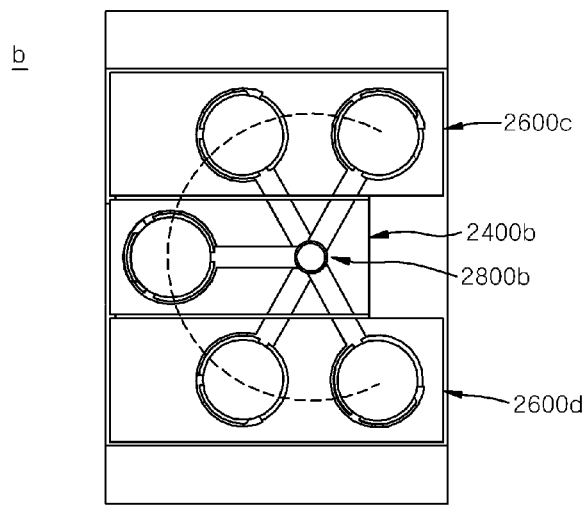
FIG. 51 is a plan view illustrating a modification of the second processing group.

FIG. 51 is a view illustrating a first aligning chamber 2600c and a second aligning chamber 2600d to align the substrates respectively. As illustrated in FIG. 51, the first and second aligning chambers 2600c and 2600d may be configured, like the first and second process chambers 2500a and 2500b, such that two substrates can be aligned in one chamber.

Figure 52:
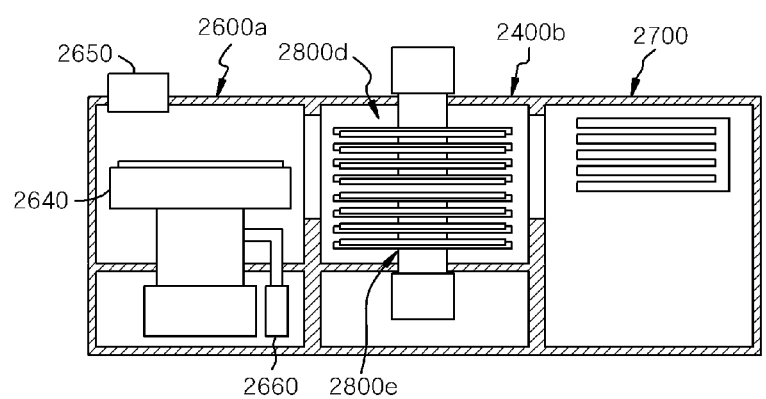
FIG. 52 is a front sectional view illustrating another modification of the second processing group in which an aligning chamber and a cooling chamber are arranged on both sides.

FIG. 52 is a front sectional view illustrating a modification of the second processing group. As illustrated in FIG. 52, in the modified second processing group b', any one of the first and second aligning chambers 2600a and 2600b is substituted with the cooling chamber 2700. When the second processing group b' is employed, the third processing group can be omitted.

As illustrated in FIG. 52, since time for aligning the substrates is very short, one chamber is preferably substituted with the cooling chamber. In this case, the second and third substrate transfer apparatuses 2800d and 2800e must be disposed in the second transfer chamber 2400b. In other words, the second upper substrate transfer apparatus 2800d is used for the transfer of the substrates to be aligned, and the third lower substrate transfer apparatus 2800e is used for the transfer of the substrates to be cooled. Here, since the second substrate transfer apparatus 2800d transfers one substrate once, the driving unit preferably drives the swivel plate arms to transfer the substrates independently.

Figure 53:
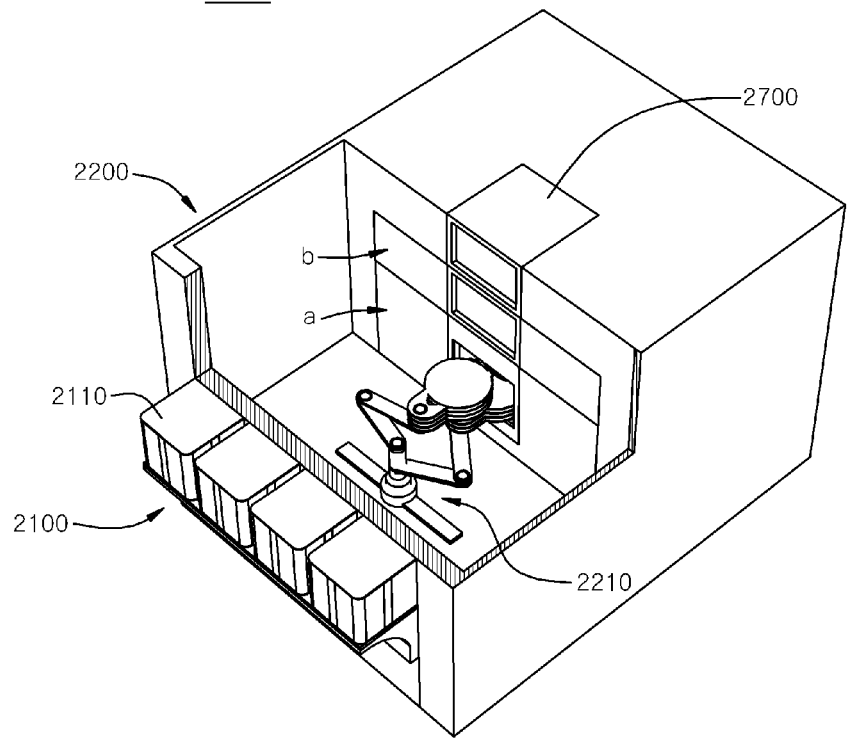
FIG. 53 is a view illustrating a modification of a substrate processing system according to the embodiment of the present invention.

The substrate processing system according to this embodiment of the present invention, as illustrated in FIG. 53, may include a single cooling chamber 2700 disposed in the upper side of the second processing group b by removing the third processing group c. The cooling chamber 2700 may include stages to which four substrates are simultaneously placed, and the four substrates are directly loaded in the cooling chamber 2700 by the atmospheric pressure transfer robot 2210.

Embodiment 5

Figure 54:
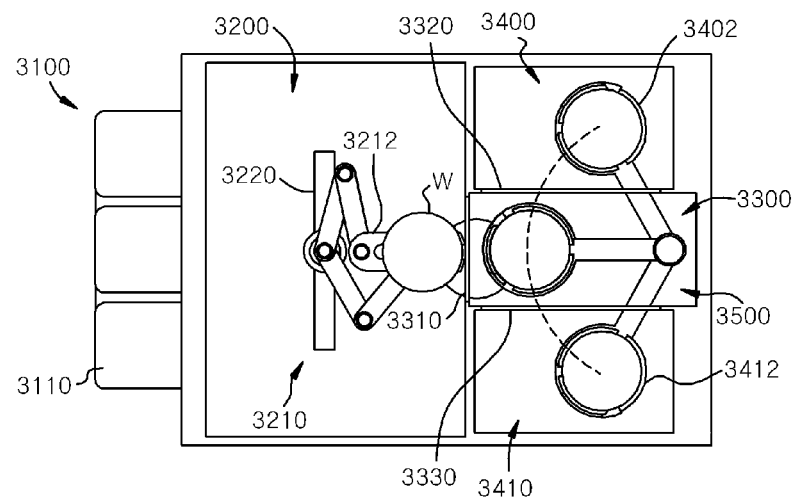
FIG. 54 is a plan view illustrating a substrate processing system according to a fifth embodiment of the present invention.

FIG. 54 is a plan view illustrating a substrate processing system according to a fifth embodiment of the present invention.

Referring to FIG. 54, the substrate processing system according to this embodiment of the present invention includes first and second process chambers 3400 and 3410, a transfer chamber 3300 disposed therebetween, and a load rock chamber 3200 provided in front of the transfer chamber 3300. An index 3100 in which a plurality of carriers 3110 are mounted is installed in front of a load lock chamber 3200. The index 3100 is referred to as an equipment front end module (hereinafter, referred to as 'EFEM') and is referred to as including the load lock chamber on occasion. If necessary, the substrate processing system may include a cooling chamber (not shown) for cooling the processed substrates.

The load lock chamber 3200 includes an atmospheric pressure transfer robot 3210 operated under the atmospheric pressure. The atmospheric pressure transfer robot 3210 transfers substrates between the transfer chamber 3300 and the index 3100. The atmospheric pressure transfer robot 3210 operates to transfer substrates W between the carriers 3110 and the transfer chamber 3300. The atmospheric pressure transfer robot 3210 is implemented by a robot including a double arm structure with four end effectors to take two substrates W out of the carrier 3110 and to put the same into the transfer chamber 3300 at once. The atmospheric pressure transfer robot 3210 includes a track 3220 along which the atmospheric pressure transfer robot 3210 moved laterally. Various robots used for common semiconductor manufacturing processes as well as the double arm type robot of this embodiment of the present invention may be used as the atmospheric pressure transfer robot 3210.

The first and second process chambers 3400 and 3410 are vacuum chambers to perform the plasma process. Respective substrate supporting tables 3402 and 3412 are provided in first and second process chambers 3400 and 3410 on respective paths where the swivel plate arms of a substrate transfer apparatus 3500 swivel. The first and second process chambers 3400 and 3410 may be configured to perform various substrate processing operations. For example, the first and second process chambers 3400 and 3410 may be ashing chambers to remove photoresist using plasma, chemical vapor deposition (CVD) chambers to depose insulating layers, etch chambers to etch apertures or openings in the insulating layers in order to form interconnection structures, physical vapor deposition (PVD) chambers to depose barrier layers, or PVD chambers to depose metal layers.

The substrates W processed by the substrate processing system according to this embodiment of the present invention are typically wafer substrates for manufacturing a semiconductor circuit or glass substrates for manufacturing an LCD. A plurality of processing systems may be required in order to perform all of the processes required for completely manufacturing an integrated circuit or a chip other than the substrate processing system according to this embodiment of the present invention. However, in order to clarify the present invention, a common structure or structures that can be understood by those skilled in the art are omitted.

The transfer chamber 3300 includes a substrate transfer apparatus 3500. A first substrate entrance 3310 is formed between the transfer chamber 3300 and a load rock chamber 3200. A second substrate entrance 3320 is formed between the transfer chamber 3300 and the first process chamber 3400, and a third substrate entrance 3330 is formed between the transfer chamber 3300 and the second process chamber 3410.

The first to third substrate entrances 3310, 3320, and 3330 are opened and closed by slit valves (not shown).

The exchange of the substrates before and after being processed in the transfer chamber 3300 performed by the atmospheric pressure transfer robot 3210 is carried out under the atmospheric pressure where the second and third substrate entrances 3320 and 3330 are closed and the first substrate entrance 3310 is opened. On the other hand, the exchange of the substrates before and after being processed performed, between the first and second process chambers 3400 and 3410 and the transfer chamber 3300 by the substrate transfer apparatus 3500, is carried out in a vacuum state where the first substrate entrance 3310 is closed and the second and third substrate entrances 3320 and 3330 are opened.

Figure 55:
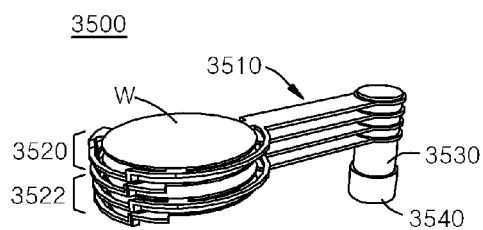
FIG. 55 is a perspective view illustrating a substrate transfer apparatus provided in the transfer chamber of FIG. 54.

FIG. 55 is a perspective view illustrating a substrate transfer apparatus provided in the transfer chamber of FIG. 54.

Referring to FIG. 55, the substrate transfer apparatus 3500 includes a driving unit 3540 to provide a rotational force, a single spindle 3530 connected to the driving unit 3540, and a plurality of swivel plate arms 3510 mounted in the spindle 3530. The plurality of swivel plate arms 3510 include first two swivel plate arms to load/unload the substrates on/from the first process chamber 3400 and second two swivel plate arms to load/unload the substrates on/from the second process chamber 3410. The first and second swivel plate arms are alternately arranged. However, the first and second swivel plate arms may be sequentially arranged. The plurality of swivel plate arms 3510 may be divided into loading arms 3520 and unloading arms 3522. In this case, the unloading arms 3522 are preferably arranged to be lower than the loading arms 3520. The loading arms 3520 and the unloading arms 3522 make pairs, and in an embodiment, as illustrated in the drawing, the four swivel plate arms that make two pairs are provided.

As illustrated in FIG. 54, the plurality of swivel plate arms 3510 are unfolded in the sector form. Although not shown in the drawing, the driving unit 3540 includes an electric motor to generate a rotational force and a gear assembly to transmit the generated rotational force to the spindle 3530 such that the plurality of swivel plate arms 3510 perform desired operations. Thus, the plurality of swivel plate arms 3510 are mounted in the spindle 3530 and, as illustrated in FIG. 54, are symmetrically unfolded in the sector form and folded about the spindle 3530.

Figure 56:
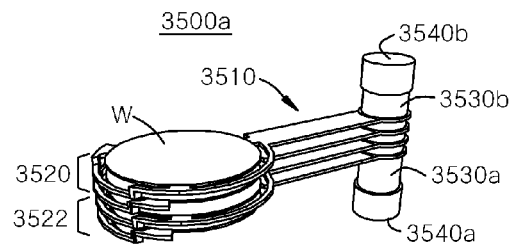
FIG. 56 illustrates an example the substrate transfer apparatus having an upper driving unit and a lower driving unit which are separated from each other.

FIG. 56 illustrates an example the substrate transfer apparatus having an upper driving unit and a lower driving unit which are separated from each other.

Referring to FIG. 56, a substrate transfer apparatus 3500a according to this embodiment of the present invention includes lower and upper spindles 3530a and 3530b to which the loading arms 3520 and the unloading arms 3522 are separately mounted and lower and upper driving units 3540a and 3540b to separately drive the lower and upper spindles 3530a and 3530b. Here, the two lower and upper spindles 3530a and 3530b are preferably aligned on the same shaft.

Figure 57:
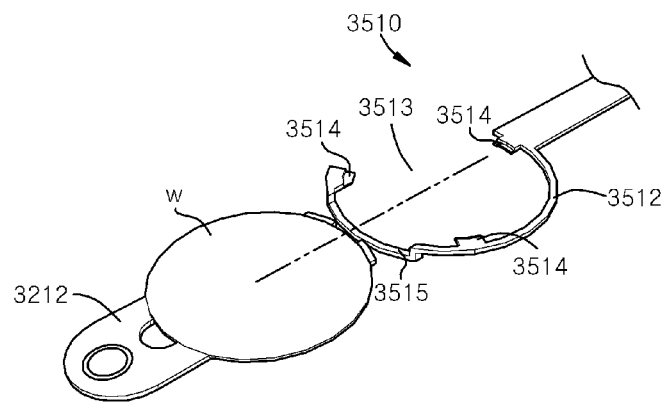
FIG. 57 is a perspective view illustrating a structure of a swivel plate arm.

FIG. 57 is a perspective view illustrating a structure of a swivel plate arm.

Referring to FIG. 57, the plurality of swivel plate arms 3510, installed in the substrate transfer apparatus 3500, include horseshoe-shaped end effectors 3512 having openings 3513 with opened sides and a plurality of supports 3514 whose upper sides to which rims of the substrates are positioned. The openings 3513 are provided to allow lift pins installed in the substrate tables to enter and exit. The end effectors 3512 have entrance paths 3515 through which end effectors 3512 of the atmospheric pressure transfer robot 3510 enter and exit. The swivel plate arms 3510 can be modified in other forms with the scope of the present invention.

The substrate transfer is performed by the substrate transfer apparatus of the present invention as follows.

In a state where the second and third substrate entrances 3320 and 3330 are closed, substrates W before being processed are transferred to the loading arm 3520 of the substrate transfer apparatus 3500 when the first substrate entrance 3310 is opened. When the transfer of the substrates W is finished, the first substrate entrance 3310 is closed and the transfer chamber 3300 is switched to the same vacuum state as the interiors of the first and second process chambers 3400 and 3410. Absolutely, a pumping system for the vacuum state is provided in the system according to this embodiment of the present invention, but is omitted for convenience.

Next, the processed substrates W stay on substrate supporting tables 3402 and 3412 of the first and second process chambers 3400 and 3410. When the lift pins of the supporting tables 3402 and 3412 ascend, the processed substrates W are elevated to a predetermined height. In association with this operation, the second and third substrate entrances 3320 and 3330 are opened. The loading arm 3520 and the unloading arm 3522 of the substrate transfer apparatus 3500 make pairs and are unfolded in the sector form. At this time, the processed substrates W are transferred from the lift pins to the unloading arms 3522.

After the transfer of the substrates W, the unloading arms 3522 return to the initial positions of the transfer chamber 3300. The lift pins ascend again to receive the substrates W before being processed. The loading arms 3520 return to the initial positions of the transfer chamber 3300, and simultaneously the second and third substrate entrances 3320 and 3330 are closed again. In association with this operation, the lift pins descend to place the substrates W before being processed on the substrate supporting tables 3402 and 3412. Next, the transfer chamber 3300 is switched to the atmospheric pressure state and the first substrate entrance 3310 is opened. The atmospheric pressure transfer robot 3210 of the load rock chamber 3200 receives the processed substrates W from the unloading arms 3522 and exits from the transfer chamber 3400.

Such the sequential operations of exchanging the substrates are continuously and simultaneously performed within a range where the prior and post operations do not interfere with each other in order to minimize time required to exchange the substrates. The exchanges of the substrates before and after being processed are simultaneously performed by the substrate transfer apparatus 3500 of the transfer chamber 3300 and the atmospheric pressure transfer robot 3210. In other words, the exchange of the substrates is performed between the transfer chamber 3400 and the load lock chamber 3200 by which the processed substrates unloaded in the prior operation are exchanged with the substrates before being processed to be loaded simultaneously. The unloaded processed substrates W are accumulated in the carriers 3110 by the atmospheric pressure transfer robot 3210.

If the unloaded substrates W need to be cooled, the substrate processing system may include a cooling chamber to cool the substrates. To this end, the cooling chamber may be installed at a proper position of the substrate processing system. Alternately, one of the first and second process chambers 3400 and 3410 may serve to as a cooling chamber. For example, it is possible to implement the first process chamber 3400 as a plasma chamber and the second process chamber 3410 as a cooling chamber. In this case, the first process chamber 3400 performs the plasma process of the substrates, the substrate transfer apparatus 3500 transfers the processed substrates from the first process chamber 3400 to the second process chamber 3410 to cool. The cooled substrates may be transferred from the second process chamber 3410 to the load rock chamber 3200.

If the substrates W before being processes required to be aligned, the substrate processing system may further include an aligning device to align the substrates. To this end, the aligning device may be installed to a proper position in the substrate processing system. Alternately, one of the first and second process chambers 3400 and 3410 may be used as the aligning device. For example, it is possible to implement the first process chamber 3400 as a plasma chamber and the second process chamber 3410 as the aligning device. In this case, the substrate transfer apparatus 3500 transfer the substrates in the second process chamber 3410 to be aligned before being processes before the first process chamber 3400 performs the plasma process of the substrates, and the substrates are transferred to the first process chamber 3400 to perform the plasma process.

As such, according to the substrate processing system in accordance with this embodiment of the present invention, in order to simultaneously process a plurality of substrates, the first and second process chambers 3400 and 3410 are arranged in parallel and the transfer chamber 3300 is positioned between the first and second process chambers 3400 and 3410. The substrate transfer apparatus is provided to enable the fast exchange of the substrates in this configuration, so that substrates before and after being processed can be simultaneously processed and rapidly exchanged.

Figure 58:
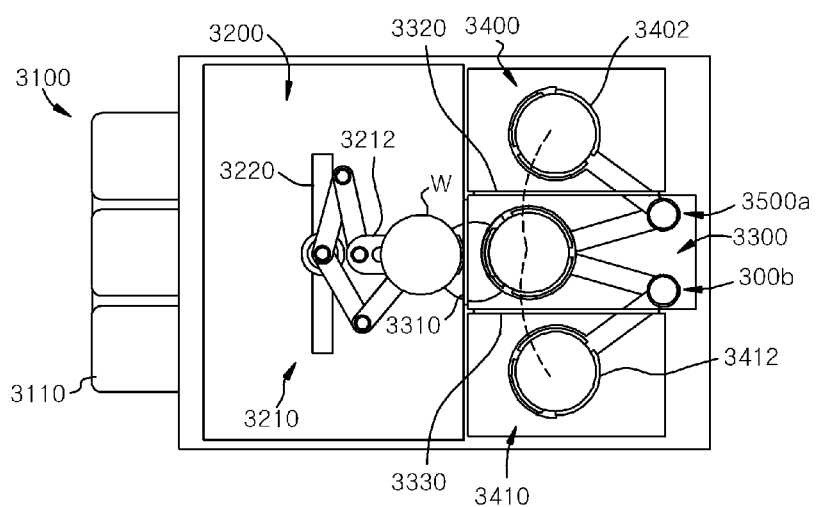
FIG. 58 is a plan view illustrating a substrate processing system having a separately driven type substrate transfer apparatus.
Figure 59:
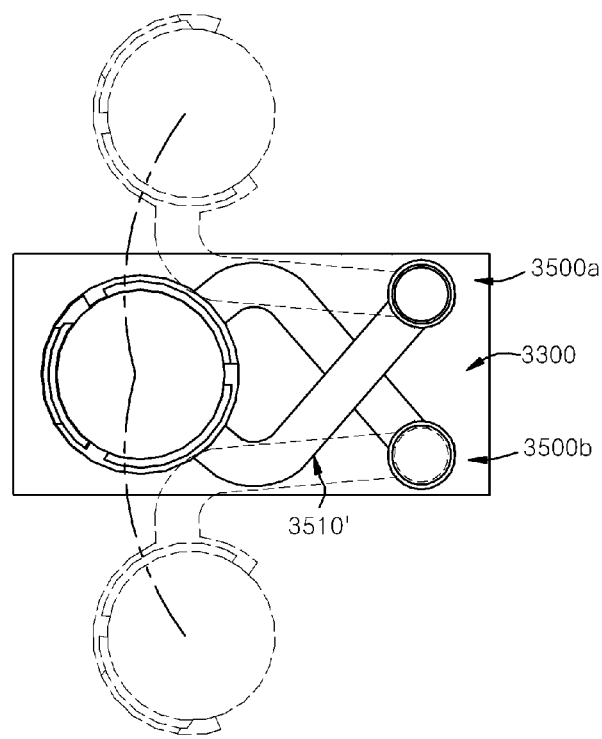
FIG. 59 is a plan view illustrating a modification of the swivel plate arm.

FIG. 58 is a plan view illustrating a substrate processing system having a separately driven substrate transfer apparatus, and FIG. 59 is a plan view illustrating a modification of the swivel plate arm.

Figure 32:
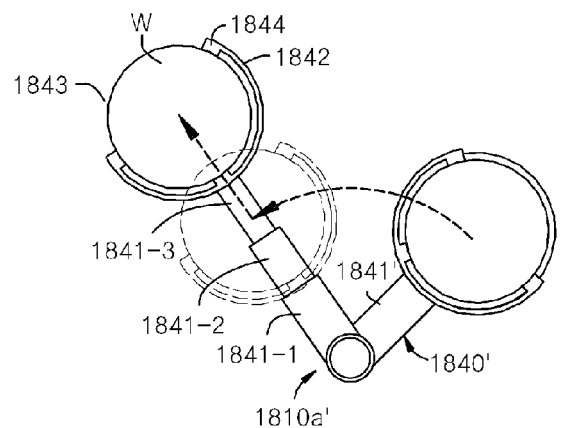
FIG. 32 is a view illustrating a transfer member having an extensible swivel plate arm.

Referring to FIG. 58, the separately driven substrate transfer apparatuses 3500a and 3500b are divided into right and left parts to be independently driven and are installed in a transfer chamber 3300. In other words, one substrate transfer apparatus 3500a transfers the substrates of the first process chamber 3400 and the other substrate transfer apparatus 3500b transfers the substrates of the second process chamber 3410. Since the detailed configurations of the separately driven substrate transfer apparatuses 3500a and 3600b are the same as those in FIGS. 32 and 33, the description is omitted. As illustrated in FIG. 59, the separately driven substrate transfer apparatuses 3500a and 3600b may include L-shaped swivel plate arms 3510'.

Figure 60:
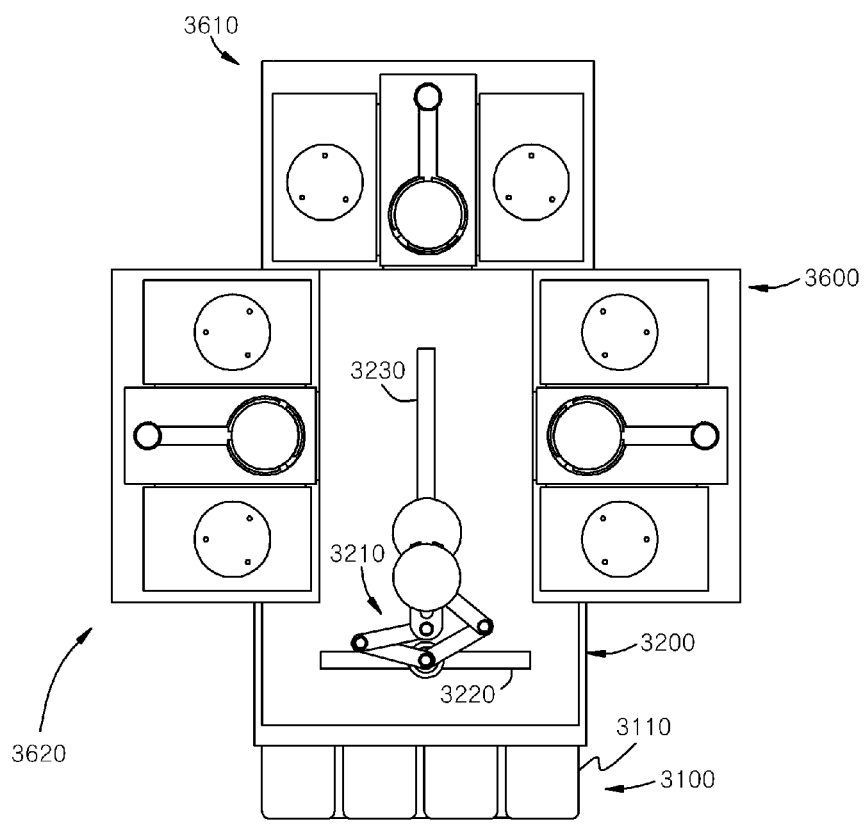
FIG. 60 is a plan view illustrating a substrate processing system having a plurality of processing groups.

FIG. 60 is a plan view illustrating a substrate processing system having a plurality of processing groups.

Referring to FIG. 60, the substrate processing system includes a plurality of processing groups 3600, 3610, and 3620. The plurality of processing groups 3600, 3610, and 3620, like the configuration as illustrated in FIG. 54, the transfer chamber located in the center and the plasma process chambers respectively disposed at the lateral sides of the transfer chamber. Among the plurality of processing groups 3600, 3610, and 3620, first and third processing groups 3600 and 3620 face each other and second processing groups 3610 are disposed in the rear side. The atmospheric pressure transfer robot 3210 positioned in the load rock chamber 3200 includes tracks 3220 and 3230 arranged in a T-shape.

The atmospheric pressure transfer robot 3210 moves along the tracks 3220 and 3230 to transfer the substrates between the carriers 3110 of the index 3100 and the first to third processing groups 3600, 3610, and 3620. The two process chambers provided in the first to third processing groups 3600, 3610, and 3620 may be chambers to perform the plasma process. Otherwise, any one of them may be a cooling chamber or an aligning device. Alternately, both of two process chambers, provided in any one of the first to third processing groups 3600, 3610 and 3620 may be cooling chambers or aligning devices. As such, at least one of the plurality of process chambers provided in the first to third processing groups 3600, 3610 and 3620 may be a cooling chamber and/or at least one aligning device.

The invention has been described using preferred exemplary embodiments. However, it is to be understood that the scope of the invention is not limited to the disclosed embodiments. On the contrary, the scope of the invention is intended to include various modifications and alternative arrangements of the substrate transfer apparatus and the substrate processing system of the present invention within the capabilities of persons skilled in the art using presently known or future technologies and equivalents. The scope of the claims, therefore, should be accorded the broadest interpretation so as to encompass all such modifications and similar arrangements.

INDUSTRIAL APPLICABILITY

As described above, according to the present invention, substrates before and after being processed are rapidly exchanged in the substrate processing system in which a plurality of substrates is simultaneously or continuously processed, so that processing rate of the system can be increased and overall productivity of the substrates can be increased. Since a substrate transfer apparatus to simultaneously load and unload the substrate is provided, the process chamber is very easily implemented to process the plurality of substrates. Time for transferring substrates is reduced and as a result productivity increases. The area and width of the system are significantly reduced so that apparatus cost and installation cost can be minimized. Respective chambers for processing, aligning, and cooling the substrates are overlapped with each other so that a total bottom area of the substrate processing system can be reduced. Due to this, the clean room can be narrower than the conventional one and costs for the air-conditioning apparatus of the clean room can also be reduced. Moreover, since the traveling distance of the atmospheric pressure transfer robot for transferring the aligned substrates to a place for the process of the substrates or for transferring the processed substrates to the place for the cooling of the substrates is short and unnecessary operation such as a direction change does not need, time for the transfer of the substrates can be reduced and yield thereof can be increased.

The invention claimed is:

1. An apparatus for transferring substrates between a load lock chamber and a first process chamber and a second process chamber to process the substrates, the apparatus comprising:
a driving unit to supply a rotational force;
at least one spindle connected to the driving unit;
a plurality of first swivel plate arms connected to the at least one spindle to unload processed substrates from the first process chamber to the load lock chamber and simultaneously load unprocessed substrates from the load lock chamber to the first process chamber; and
a plurality of second swivel plate arms connected to the at least one spindle to unload processed substrates from the second process chamber to the load lock chamber and simultaneously load unprocessed substrates from the load lock chamber to the second process chamber,
wherein the plurality of first swivel plate arms and the plurality of second swivel plate arms each comprise an end effector, the end effector comprising:
a generally circular frame having a first end that connects to an end of each of the plurality of first swivel plate arms and to an end of each of the plurality of second swivel plate arms, and a second end that defines, in conjunction with the end of each of the plurality of first swivel plate arms and the end of each of the plurality of second swivel plate arms, an opening in the generally circular frame,
rises located on the generally circular frame, the rises to contact edges of a substrate received by the end effector, and
an entrance path defined by the generally circular frame, the entrance path to receive a transfer robot to add or remove the substrate from the end effector, wherein the entrance path defined by generally circular frame is different than the opening in the generally circular frame.

2. The apparatus for transferring substrates of claim 1, wherein the plurality of first swivel plate arms and the plurality of second swivel plate arms are separately mounted, and the at least one spindle includes at least two different spindles that rotate independently.

3. The apparatus for transferring substrates of claim 2, wherein the driving unit includes at least one driving unit to supply a rotational force through the at least two different spindles.

4. A substrate processing system comprising:
a first process chamber having at least two substrate supporting tables located therein;
a second process chamber having at least two substrate supporting tables located therein;
a transfer chamber in which a substrate transfer apparatus is installed;
a first substrate entrance formed between the first process chamber and the transfer chamber;
a second substrate entrance formed between the second process chamber and the transfer chamber; and
a third substrate entrance formed between the transfer chamber and a space exterior to the transfer chamber,
wherein the substrate transfer apparatus includes:
a driving unit to supply a rotational force,
at least one spindle connected to the driving unit,
a plurality of first swivel plate arms connected to the at least one spindle to unload processed substrates from the first process chamber to the transfer chamber and simultaneously load unprocessed substrates from the transfer chamber to the first process chamber, and
a plurality of second swivel plate arms connected to the at least one spindle to unload processed substrates from the second process chamber to the transfer chamber and simultaneously load unprocessed substrates from the transfer chamber to the second process chamber,
wherein the substrate transfer apparatus receives and transfers, through the third substrate entrance, the unprocessed and processed substrates from and to the space exterior to the transfer chamber, such that the unprocessed substrates are transferred to the first process chamber and the second process chamber and the processed substrates are simultaneously transferred from the first process chamber and the second process chamber to the space exterior to transfer chamber through the third substrate entrance, and
wherein the plurality of first swivel plate arms and the plurality of second swivel plate arms each comprises an end effector, the end effector comprising:

a generally circular frame having a first end that connects to an end of each of the plurality of first and second swivel plate arms and to an end of each of the plurality of second swivel plate arms, and a second end that defines, in conjunction with the end of each of the plurality of first swivel plate arms and the end of each of the plurality of second swivel plate arms, an opening in the generally circular frame, rises located on the generally circular frame, the rises to contact edges of a substrate received by the end effector, and an entrance path defined by the generally circular frame, the entrance path to receive a transfer robot to add or remove the substrate from the end effector, wherein the entrance path defined by generally circular frame is different than the opening in the generally circular frame.

5. The substrate processing system of claim 4, wherein the space exterior to the transfer chamber is a load lock chamber, and the transfer robot is located in the load lock chamber and is an atmospheric pressure transfer robot to transfer the substrates under atmospheric pressure.

6. The substrate processing system of claim 4, further comprising:

a cooling chamber to cool the processed substrates discharged through the third substrate entrance.

7. The substrate processing system of claim 4, further comprising:

a fourth substrate entrance formed between the transfer chamber and a second load lock chamber exterior to the transfer chamber, wherein the substrate transfer apparatus receives the unprocessed substrates from the load lock chamber through the third substrate entrance and transfers the processed substrates to the second load lock chamber through the fourth substrate entrance.

8. The substrate processing system of claim 7, wherein an atmospheric pressure transfer robot to transfer the substrates under the atmospheric pressure is located in the second load lock chamber.

9. The substrate processing system of claim 8, further comprising:

a cooling chamber located in the second load lock chamber to cool the processed substrates.

10. An apparatus for transferring substrates between a load lock chamber and process chambers to process the substrates, the apparatus comprising:

transfer members located in a transfer chamber positioned between the load lock chamber and the process chambers;

wherein the transfer members are to:

transfer a plurality of unprocessed substrates from the load lock chamber to a standby position in the transfer chamber, transfer the plurality of unprocessed substrates from the transfer chamber to upper sides of substrate supporting tables installed in the process chambers, simultaneously transfer processed substrates from the upper sides of the substrate supporting tables to the standby position in the transfer chamber, and transfer the processed substrates from the standby position to the load lock chamber; and wherein each of the transfer members comprises:

a driving unit to supply a rotational force, a first spindle and a second spindle each connected to the driving unit, and a plurality of loading swivel plate arms connected to the first spindle to load the unprocessed substrates from the load lock chamber to corresponding substrate supporting tables, a plurality of unloading swivel plate arms connected to the second spindle to unload the processed substrates from the corresponding substrate supporting tables to the load lock chamber, and wherein the plurality of unloading swivel plate arms and the plurality of loading swivel plate arms each comprises an end effector, the end effector comprising:

a generally circular frame having a first end that connects to an end of each of the plurality of loading swivel plate arms and to an end of each of the plurality of unloading swivel plate arms, and a second end that defines, in conjunction with the end of each of the plurality of loading swivel plate arms and the end of each of the plurality of unloading swivel plate arms, an opening in the generally circular frame, rises located on the generally circular frame, the rises to contact edges of a substrate received by the end effector, and an entrance path defined by the generally circular frame, the entrance path to receive a transfer robot to add or remove the substrate from the end effector, wherein the entrance path defined by generally circular frame is different than the opening in the generally circular frame.

11. A substrate transfer apparatus installed in a transfer chamber, the substrate transfer apparatus to transfer substrates between a load lock chamber and process chambers to process the substrates, the substrate transfer apparatus comprising:

a plurality of spindles spaced apart from each other in the transfer chamber;

a driving unit to supply a driving force to the plurality of spindles; and a loading swivel plate arm rotatably connected to each spindle, of the plurality of spindles, to load unprocessed substrates from the load lock chamber to a process chamber, an unloading swivel plate arm rotatably connected to each spindles, of the plurality of spindles, to unload processed substrates from a process chamber to the load lock chamber; and an end effector connected to each loading swivel plate arm and each unloading swivel plate arm, the end effector comprising:

a generally circular frame having a first end that connects to an end of each loading swivel plate arm and to an end of each unloading swivel plate arm, and a second end that defines, in conjunction with the end of each loading swivel plate arm and the end of each unloading swivel plate arm, an opening in the generally circular frame, rises located on the generally circular frame, the rises to contact edges of a substrate received by the end effector, and an entrance path defined by the generally circular frame, the entrance path to receive a transfer robot to add or remove the substrate from the end effector, wherein the entrance path defined by generally circular frame is different than the opening in the generally circular frame.

12. The substrate transfer apparatus of claim 11, wherein the loading swivel plate arm and the unloading swivel plate arm each comprises at least two rod-antenna type extensible swivel plate arms.

13. The substrate transfer apparatus of claim 12, wherein the loading swivel plate arm and the unloading swivel plate arm swivel toward corresponding substrate supporting tables located in the process chambers and the extensible rod-antenna type swivel plate arms are extended in a step-by-step manner, such that the end effectors are positioned at the upper sides of the substrate supporting tables.

14. A substrate processing system comprising:
  a transfer chamber having a substrate transfer apparatus located therein, the substrate transfer apparatus including four transfer members spaced apart from each other in the transfer chamber
  a first process chamber connected to a first side of the transfer chamber through a first entrance, the first process chamber having two substrate supporting tables located therein; and
  a second process chamber connected to a second side the transfer chamber through a second entrance, the second process chamber having two substrate supporting tables located therein,
  wherein each of the four transfer members comprises:
    a driving unit to supply a rotational force,
    a first spindle and a second spindle each connected to the driving unit,
    a plurality of loading swivel plate arms connected to the first spindle to transfer the unprocessed substrates from the transfer chamber to the first process chamber and the second process chamber;
  a plurality of unloading swivel plate arms connected to the second spindle to transfer processed substrates from the first process chamber and the second process chamber to the transfer chamber,
  wherein each of the plurality of loading swivel plate arms are movable to a folded position to transfer four unprocessed substrates from a location exterior to the transfer chamber to a standby position in the transfer chamber,
  wherein each of the plurality of loading swivel plate arms are movable to an unfolded position to transfer the four unprocessed substrates to upper sides of the two first substrate supporting tables and the two second substrate supporting tables
  wherein each of the plurality of unloading swivel plate arms are movable to an unfolded position to simultaneously receive processed substrates from the upper sides of the two first substrate supporting tables and the two second substrate supporting tables,
  wherein each of the plurality of unloading swivel plate arms are movable to a folded position to transfer the processed substrates to the standby position in the transfer chamber, and
  wherein each of the plurality of loading swivel plate arms and unloading swivel plate arms comprises an end effector, the end effector comprising:
    a generally circular frame having a first end that connects to an end of each of the plurality of loading swivel plate arms and an end of each of the unloading swivel plate arms, and a second end that defines, in conjunction with the end of each of the plurality of loading swivel plate arms and the end of each of the unloading swivel plate arms, an opening in the generally circular frame,
    rises located on the generally circular frame, the rises to contact edges of a substrate received by the end effector, and
    an entrance path defined by the generally circular frame, the entrance path to receive a transfer robot to add or remove the substrate from the end effector, wherein the entrance path defined by generally circular frame is different than the opening in the generally circular frame.

15. The substrate processing system of claim 14, wherein the location exterior to the transfer chamber comprises:
  a load lock chamber connected to the transfer chamber through a third entrance, and
  wherein the transfer robot is located in the load lock chamber and is an atmospheric pressure transfer robot to transfer the unprocessed and processed substrates between the transfer chamber and the load lock chamber under atmospheric pressure.

16. The substrate processing system of claim 15, further comprising:
  a cooling chamber positioned in the load lock chamber to cool processed substrates discharged to the load lock chamber through the third substrate entrance.

17. A substrate processing system comprising:
  a load lock chamber having an index installed in one side thereof, the index including a plurality of carriers installed therein; and
  a plurality of processing groups disposed in another side of the load lock chamber and stacked in multi-layers,
  wherein a first process group, from among the plurality of process groups, comprises:
  a first transfer chamber in which a first substrate transfer apparatus is installed,
  a first process chamber connected to a first side of the first transfer chamber through a first entrance, the first process chamber having first substrate supporting tables located therein, and
  a second process chamber connected to a second side of the first transfer chamber through a second entrance, the second process chamber having second substrate supporting tables located therein; and
  wherein a second process group, from among the plurality of processing groups, comprises:
  a second transfer chamber in which a second substrate transfer apparatus is installed,
  a first aligning chamber connected to a first side of the second transfer chamber through a first entrance, the first aligning chamber having substrate aligners located therein, and
  a second aligning chamber connected to a second side of the second transfer chamber through a second entrance, the second aligning chamber having substrate aligners located therein,
  wherein the first substrate transfer apparatus and the second substrate transfer apparatus each comprises:
  a driving unit to supply a rotational force; and
  at least one spindle connected to the driving unit, and
  wherein each of the first process group and the second process group comprise:
  a plurality of unloading swivel plate arms connected to the at least one spindle to transfer unprocessed substrates from the first process chamber and the second process chamber to the first transfer chamber, and
  a plurality of unloading swivel plate arms connected to the at least one spindle to transfer the processed substrates from the first process chamber and the second process chamber to the first transfer chamber, wherein each of the plurality of loading swivel plate arms and unloading swivel plate arms comprises an end effector, the end effector comprising:
a generally circular frame having a first end that connects to an end of each of the plurality of loading swivel plate arms and an end of each of the unloading swivel plate arms, and a second end that defines, in conjunction with the end of each of the plurality of loading swivel plate arms and the end of each of the unloading swivel plate arms, an opening in the generally circular frame,
rises located on the generally circular frame, the rises to contact edges of a substrate received by the end effector, and
an entrance path defined by the generally circular frame, the entrance path to receive a transfer robot to add or remove the substrate from the end effector, wherein the entrance path defined by generally circular frame is different than the opening in the generally circular frame.

18. The substrate processing system of claim 17, wherein each of the plurality of loading swivel plate arms are movable to an unfolded position to simultaneously transfer unprocessed substrates from a standby position in the first transfer chamber to upper sides of the first substrate supporting tables and the second substrate supporting tables, and
wherein each of the plurality of unloading swivel plate arms are movable to a folded position to transfer processed substrates from the upper sides of the first substrate supporting tables and the second substrate supporting tables to the standby position in the first transfer chamber.

19. The substrate processing system of claim 17, wherein each of the plurality of unloading swivel plate arms movable to an unfolded position to simultaneously transfer unprocessed substrates from a standby position of the second transfer chamber to the substrate aligners installed in the first aligning chamber and the second aligning chamber, and
wherein each of the plurality of loading swivel plate arms are movable to a folded position to transfer aligned substrates from the substrate aligners to the standby position in the second transfer chamber.

20. The substrate processing system of claim 17, wherein a third process group, of the plurality of processing groups, comprises:
a third transfer chamber in which a third substrate transfer apparatus is installed; and
a cooling chamber connected to a side of the third transfer chamber through a fourth entrance to cool at least one substrate.

21. The substrate processing system of claim 20, wherein the third substrate transfer apparatus comprises:
a driving unit to supply a rotational force;
at least one spindle connected to the driving unit; and
a plurality of swivel plate arms mounted to the spindle at different heights and to be positioned at corresponding positions in association with the spindle.

22. The substrate processing system of claim 17, wherein the plurality of loading swivel plate arms are to simultaneously receive unprocessed substrates from a standby position in the first transfer chamber, transfer the unprocessed substrates to the first substrate supporting tables and the second substrate supporting tables, and transfer the processed substrates to the standby position of the first transfer chamber.

23. The substrate processing system of claim 17, wherein each of the substrate aligners comprises:
a spin chuck to load a substrate;
a sensor to detect an alignment of the substrate loaded by the spin chuck; and
an elevator to adjust a height of the spin chuck according to heights of the plurality of unloading swivel plate arms and the plurality of loading swivel plate arms.

24. The substrate processing system of claim 17, wherein the transfer robot is an atmospheric pressure transfer robot located in the load lock chamber to transfer the substrates under the atmospheric pressure.

25. The substrate processing system of claim 17, wherein the transfer robot is located in the load lock chamber and comprises a double-armed atmospheric pressure transfer robot having the plurality of unloading swivel plate arms and loading swivel plate arms to simultaneously transfer a plurality of unprocessed substrates from the carriers and transfer the plurality of unprocessed substrates to the first transfer chamber or the second transfer chamber,
wherein each of the first transfer chamber and the second transfer chamber has a third substrate entrance, through which the plurality of unprocessed substrates from the load lock chamber enter and exit, the third entrance of the first transfer chamber being aligned with the third entrance of the second transfer chamber each other such that the transfer of the plurality of unprocessed substrates is enabled when the atmospheric pressure transfer robot is moved up and down.

26. The substrate processing system of claim 25, wherein the plurality of loading swivel plate arms and the plurality of loading swivel plate arms are separately mounted, and the at least one spindle includes at least two different spindles that rotate independently.

27. The substrate processing system of claim 26, wherein the driving unit includes at least one driving unit to supply a rotational force through the at least two different spindles.

28. A substrate processing system comprising at least one process group, the at least one process group comprising:
a first process chamber containing a first substrate supporting table;
a second process chamber containing a second substrate supporting table;
a transfer chamber in which a substrate transfer apparatus is installed;
a first substrate entrance formed between the transfer chamber and a space exterior to the transfer chamber;
a second substrate entrance formed between the first process chamber and the transfer chamber; and
a third substrate entrance formed between the second process chamber and the transfer chamber,
wherein the substrate transfer apparatus comprises:
a driving unit to supply a rotational force;
at least one spindle connected to the driving unit;
a plurality of loading swivel plate arms connected to the at least one spindle to transfer unprocessed substrates from the transfer chamber to at least one of the first process chamber or the second process chamber; and
a plurality of unloading swivel plate arms connected to the at least one spindle to transfer the processed substrates from the at least one of the first process chamber or the second process chamber to the transfer chamber,
wherein the substrate transfer apparatus is to:
transfer the unprocessed and processed substrates between the transfer chamber and the space exterior to the transfer chamber through the first substrate entrance, transfer the unprocessed substrates from the transfer chamber to the first process chamber through the second substrate entrance or to the second process chamber through the third substrate entrance, simultaneously transfer the processed substrates from the first process chamber to the transfer chamber through the second substrate entrance or from the second process chamber through the third substrate entrance, and transfer the processed substrates to the space exterior to the transfer chamber through the first substrate entrance, and wherein each of the plurality of loading swivel plate arms and the plurality of unloading swivel plate arms comprises an end effector, the end effector comprising:

a generally circular frame having a first end that connects to an end of each of the plurality of loading swivel plate arms and an end of each of the plurality of unloading swivel plate arms, and a second end that defines, in conjunction with the end of each of the plurality of loading swivel plate arms and the end of each of the plurality of unloading swivel plate arms, an opening in the generally circular frame, rises located on the generally circular frame, the rises to contact edges of a substrate received by the end effector, and an entrance path defined by the generally circular frame, the entrance path to receive a transfer robot to add or remove the substrate from the end effector, wherein the entrance path defined by generally circular frame is different than the opening in the generally circular frame.

29. The substrate processing system of claim 28, further comprising:

a load lock chamber connected to the first substrate entrance, wherein the transfer robot is located in the load lock chamber, the transfer robot comprising an atmospheric pressure transfer robot to transfer the substrates under the atmospheric pressure.

30. The substrate processing system of claim 28, wherein at least one of the first process chamber or the second process chamber has a cooling chamber located therein.

31. The substrate processing system of claim 28, wherein at least one of the first process chamber or the second process chamber is an aligning chamber.

\* \* \* \* \*